(12) United States Patent
Morris et al.

(10) Patent No.: US 11,061,590 B2
(45) Date of Patent: *Jul. 13, 2021

(54) EFFICIENTLY TRAINING MEMORY DEVICE CHIP SELECT CONTROL

(71) Applicant: Intel Corporation, Santa Clara, CA (US)

(72) Inventors: Tonia G. Morris, Wendell, NC (US); Christopher P. Mozak, Portland, OR (US); Christopher E. Cox, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/547,197

(22) Filed: Aug. 21, 2019

(65) Prior Publication Data
US 2020/0110551 A1 Apr. 9, 2020

Related U.S. Application Data

(63) Continuation of application No. 15/721,516, filed on Sep. 29, 2017, now Pat. No. 10,416,912.

(60) Provisional application No. 62/416,700, filed on Nov. 3, 2016.

(51) Int. Cl.
G06F 3/06 (2006.01)
G11C 11/4076 (2006.01)
G11C 8/12 (2006.01)
G11C 29/00 (2006.01)
G11C 29/02 (2006.01)

(52) U.S. Cl.
CPC .......... *G06F 3/0632* (2013.01); *G06F 3/0604* (2013.01); *G06F 3/0673* (2013.01); *G11C 8/12* (2013.01); *G11C 11/4076* (2013.01); *G11C 29/00* (2013.01); *G11C 29/028* (2013.01)

(58) Field of Classification Search
CPC ....... G06F 3/0604; G06F 3/0673; G11C 8/12; G11C 11/4076
USPC ......................................................... 711/105
See application file for complete search history.

(56) References Cited

U.S. PATENT DOCUMENTS

| | | |
|---|---|---|
| 7,432,731 B2 | 10/2008 | Bains et al. |
| 7,602,056 B2 | 10/2009 | Zhao et al. |
| 8,819,474 B2 | 8/2014 | Schoenborn et al. |
| 8,996,934 B2 | 3/2015 | Mozak et al. |
| 9,021,154 B2 | 4/2015 | Morris et al. |
| 9,025,399 B1 | 5/2015 | Morris et al. |

(Continued)

OTHER PUBLICATIONS

Notice of Allowance for U.S. Appl. No. 15/721,516, dated May 7, 2019, 10 pages.

*Primary Examiner* — Than Nguyen
(74) *Attorney, Agent, or Firm* — Compass IP Law PC

(57) ABSTRACT

A chip select training mode (CSTM) enables a memory subsystem to train a chip select signal separately from command bus training. A memory device and a memory controller can connect via a command bus including a chip select signal line. Instead of training the chip select along with other signal lines of the command bus, a CSTM mode enables the memory subsystem to more accurately train the chip select. The memory device can be triggered for CSTM mode with a command, and then train voltage margining for the CS signal line to align chip select signaling with the memory subsystem clock signal.

19 Claims, 11 Drawing Sheets

(56) References Cited

U.S. PATENT DOCUMENTS

| | | | |
|---|---|---|---|
| 9,026,725 B2 | 5/2015 | Kostinsky et al. | |
| 9,471,094 B1 | 10/2016 | Brahmadathan et al. | |
| 9,627,029 B2 | 4/2017 | Morris et al. | |
| 10,148,416 B2 | 12/2018 | Morris et al. | |
| 2014/0181391 A1* | 6/2014 | Malladi | G11C 7/1072 |
| | | | 711/105 |
| 2014/0181392 A1* | 6/2014 | Malladi | G11C 29/028 |
| | | | 711/105 |
| 2014/0281392 A1 | 9/2014 | Tuck et al. | |
| 2017/0110165 A1* | 4/2017 | Kim | G11C 8/18 |
| 2017/0110169 A1* | 4/2017 | Kim | G11C 7/12 |
| 2018/0122486 A1 | 5/2018 | Choi et al. | |

* cited by examiner

600

| | CSTM OUTPUT | PRIMARY CS_n SAMPLE | SECONDARY CS_n SAMPLE |
|---|---|---|---|
| 602 | 1 | 0 | 0 |
| 606 | 0 | 0 | 1 |
| 606 | 1 | 1 | 1 |
| 608 | 1 | 1 | 0 |

FIG. 6

710    SAMPLE EVALUATION: INTERMEDIATE OUTPUT[0]

| | OUTPUT[0] | CS_n_SAMPLE[0] | CS_n_SAMPLE[1] |
|---|---|---|---|
| 712 | 1 | 0 | 0 |
| 714 | 0 | 0 | 1 |
| 716 | 1 | 1 | 0 |
| 718 | 1 | 1 | 1 |

720    SAMPLE EVALUATION: INTERMEDIATE OUTPUT[1]

| | OUTPUT[1] | CS_n_SAMPLE[2] | CS_n_SAMPLE[3] |
|---|---|---|---|
| 722 | 1 | 0 | 0 |
| 724 | 0 | 0 | 1 |
| 726 | 1 | 1 | 0 |
| 728 | 1 | 1 | 1 |

730    SAMPLE EVALUATION: FINAL CSTM OUTPUT

| | CSTM OUTPUT | OUTPUT[0] | OUTPUT[1] |
|---|---|---|---|
| 732 | 1 | 0 | 0 |
| 734 | 0 | 0 | 1 |
| 736 | 1 | 1 | 0 |
| 738 | 1 | 1 | 1 |

| | SYMBOL | DESCRIPTION | MIN | MAX | UNIT |
|---|---|---|---|---|---|
| 802 | tCSTM_ENTRY | REGISTRATION OF CSTM ENTRY COMMAND TO START OF TRAINING SAMPLES TIME | – | 20 | ns |
| 804 | tCSTM_EXIT | REGISTRATION OF CSTM EXIT COMMAND TO END OF TRAINING MODE | – | 20 | ns |
| 806 | tCSTM_VALID | TIME FROM SAMPLE EVALUATION TO OUTPUT ON DQ BUS | – | 20 | ns |
| 808 | tCSTM_DQ_WINDOW | TIME OUTPUT IS AVAILABLE ON DQ BUS | 2 | – | nCK |
| 810 | tCSTM_CS_ENTRY | TIME CS_n HELD LOW TO REGISTER ENTRY COMMAND | 3.5 | 8 | nCK |
| 812 | tCSTM_CS_EXIT | TIME CS_n HELD LOW TO REGISTER EXIT COMMAND | – | 8 | nCK |
| 814 | tCSTM_SU | COMMAND TO CS_n LOW SETUP TIME | | | |

| OUTPUT | X16 | X8 | X4 |
|---|---|---|---|
| DQ0 | CSTM OUTPUT | CSTM OUTPUT | CSTM OUTPUT |
| DQ1 | CSTM OUTPUT | CSTM OUTPUT | CSTM OUTPUT |
| DQ2 | CSTM OUTPUT | CSTM OUTPUT | CSTM OUTPUT |
| DQ3 | CSTM OUTPUT | CSTM OUTPUT | CSTM OUTPUT |
| DQ4 | CSTM OUTPUT | CSTM OUTPUT | |
| DQ5 | CSTM OUTPUT | CSTM OUTPUT | |
| DQ6 | CSTM OUTPUT | CSTM OUTPUT | |
| DQ7 | CSTM OUTPUT | CSTM OUTPUT | |
| DML | | | |
| TDQS_c | | | |
| DQSL | | | |
| DQSL_B | | | |
| DQ8 | CSTM OUTPUT | | |
| DQ9 | CSTM OUTPUT | | |
| DQ10 | CSTM OUTPUT | | |
| DQ11 | CSTM OUTPUT | | |
| DQ12 | CSTM OUTPUT | | |
| DQ13 | CSTM OUTPUT | | |
| DQ14 | CSTM OUTPUT | | |
| DQ15 | CSTM OUTPUT | | |
| DMU | | | |
| DQSU | | | |
| DQSU_B | | | |

902: DQ0–DQ3
904: DQ4–DQ7
906: DML, TDQS_c, DQSL, DQSL_B
908: DQ8–DQ15
910: DMU, DQSU, DQSU_B

FIG. 9

EFFICIENTLY TRAINING MEMORY DEVICE CHIP SELECT CONTROL

PRIORITY

The present application is a Continuation of U.S. application Ser. No. 15/721,516, filed Sep. 29, 2019, now U.S. Pat. No. 10416,912, which in turn is a nonprovisional application based on U.S. Provisional Patent Application No. 62/416,700, filed Nov. 3, 2016. The present application claims the benefit of priority of these applications.

FIELD

Descriptions are generally related to computer memory systems, and more particular descriptions are related to training chip select control for a memory subsystem command bus.

BACKGROUND

The standardization of many memory subsystem processes allows for interoperability among different device manufacturers. The standardization allows building devices with different architectural designs and different processing technologies which will function according to specified guidelines. Memory devices receive commands from memory controllers over command buses, which are traditionally trained to ensure that the signaling between the devices meets the expected standards. Training can refer to iterative testing of different I/O (input/output) interface parameters to determine settings that result in best accuracy of signaling on the signal lines. With decreasing device geometries, smaller package sizes, increasing channel bandwidth, and increasing signaling frequencies, differences in design can result in variations in how signals are sent and received between a memory controller and memory device. Thus, the significant variation in memory channel layouts makes it unlikely if not impossible for memory device suppliers to guarantee the memory device will operate in its default state without training the command signaling. Chip select (CS) is a signaling standard used to identify a device that should execute a command on the command bus, and can operate as a trigger for the sending and receiving of data and commands. CS training is traditionally executed as part of command bus training. Without proper I/O training, command and data transfers may be unreliable.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 6 is a representation of an embodiment of chip select training evaluation.

FIG. 7 is a representation of an embodiment of sample evaluation for chip select training mode output.

FIG. 8 is a representation of an embodiment of AC parameters for a chip select training mode.

FIG. 9 is a representation of an embodiment of a chip select sample output per interface width.

Figure 1:
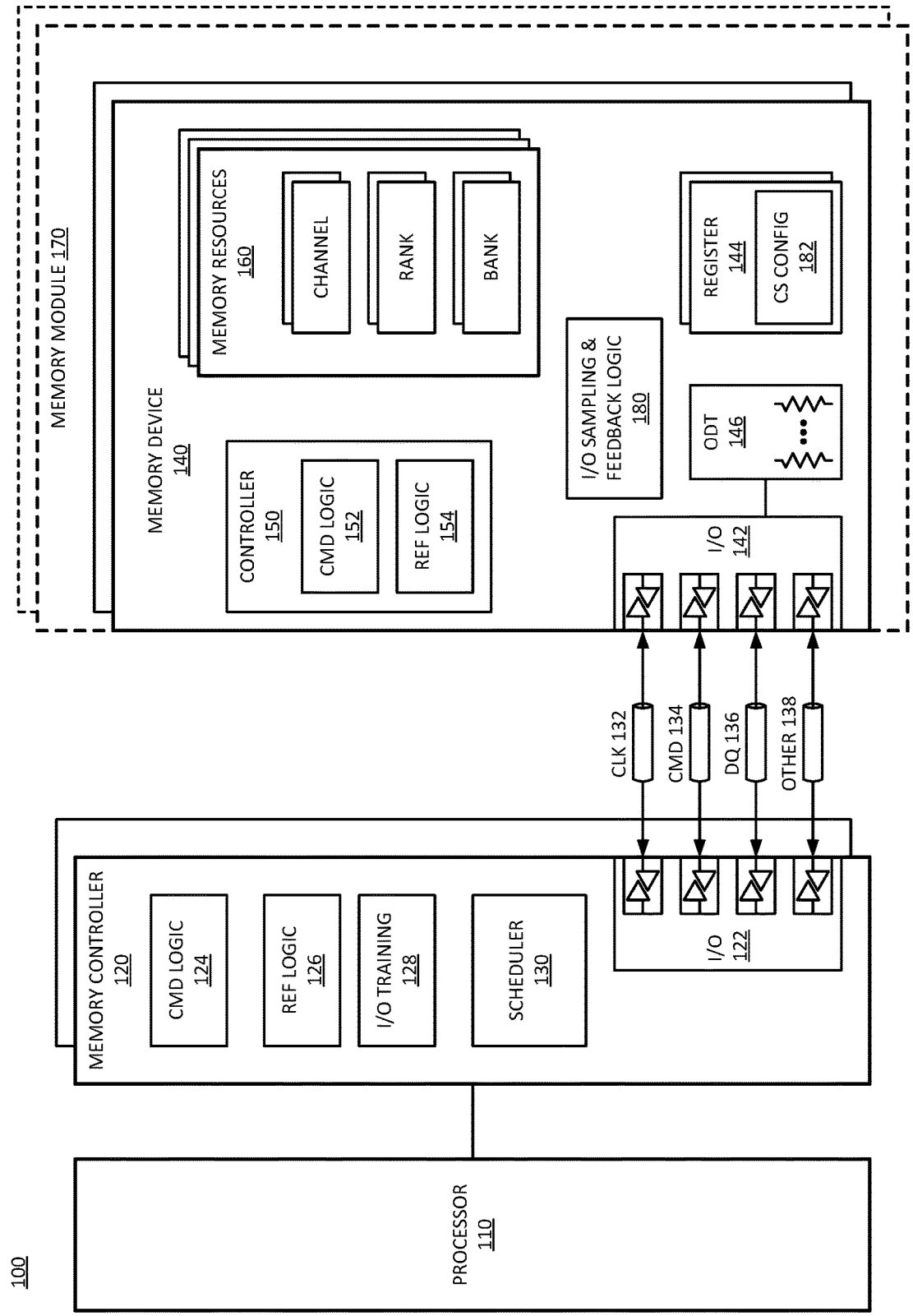
FIG. 1 is a block diagram of an embodiment of a memory subsystem in which a chip select training mode can be implemented.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a chip select training mode (CSTM) enables a memory subsystem to train a chip select signal separately from command bus training. A memory device and a memory controller can connect via a command bus including a chip select signal line. Instead of training the chip select along with other signal lines of the command bus, a CSTM mode enables the memory subsystem to more accurately train the chip select. Thus, chip select (CS) training can occur first, and as accurately as possible, which can improve the accuracy of training for other signal lines, such as command and address signal lines and data signal lines. The memory device can be triggered for CSTM mode with a command, and then train voltage margining for the CS signal line to align chip select signaling with the memory subsystem clock signal. In one embodiment, CS training is considered to occur prior to CA (command/address) training. CA refers to training other signals of the command or CA bus, and CA training in turn can occur prior to DQ (data) training, referring to training the data bus. Training in sequence the CS signal, then the CA bus, and then the DA bus, the channel robustness builds from accuracy of the CS training, to accuracy of the CA training. Such training sequences can ensure that DQ signaling is more accurately trained to ensure proper data exchange.

In one embodiment, a CSTM is provided to facilitate loopback of a sampled sequence of a CS_n signal, which can refer to a chip select signal line. The CS_n signal allows the selection of the specific memory devices. In one embodiment, for a CSTM mode, the clock (CK) runs continuously. In one embodiment, for a CSTM mode, the CA signals are held in a NOP command encoding state. In one embodiment, the memory devices, such as DRAM (dynamic random access memory) devices, are selected to actively sample and drive feedback after the enablement of such a training mode. In one embodiment, the DRAM device or memory device samples the CS_n signal on the rising edge of the CK signal.

In one embodiment, in the training mode the memory device considers every other CK rising edge as the primary sample point, with the remaining rising edges as the secondary sample points. It will be understood that it is not relevant which edge the memory device samples first. Thus, the zeroeth rising edge, the second rising edge, the fourth rising edge, and so forth, will be considered the primary sample points, and the first rising edge, the third rising edge, and so forth, with be considered the secondary sample points, starting with whatever sample the device samples first. In one embodiment, the primary rising edges must not change throughout the operation of the training mode. In one embodiment, when the primary sample results in a logic 0 and the secondary sample results in a logic 1, the DRAM will drive a 0 on all the DQ signals. In one embodiment, there is no requirement to drive any strobes, and the output signal could transition as often as every 2 tCK.

Previous training designs combine the CS training into the CA training, not allowing individual control over the CS. Errors in CS signaling can thus create the appearance of signaling errors in other CA signals. In addition to providing more accurate control over the CS signal, and consequently over the CA signals, a two-sample CS training approach (sampling two samples and comparing) can allow for a very simple and accurate method of determining the rising and falling edge of the CS signal. More accurate training of the CS by separately training the CS signal line or CS signal line interface, separately from the rest of the CA bus, enables improved overall I/O interface signaling accuracy as compared to previous approaches to training.

FIG. 1 is a block diagram of an embodiment of a memory subsystem in which a chip select training mode can be implemented. System 100 includes a processor and elements of a memory subsystem in a computing device. Processor 110 represents a processing unit of a computing platform that may execute an operating system (OS) and applications, which can collectively be referred to as the host or the user of the memory. The OS and applications execute operations that result in memory accesses. Processor 110 can include one or more separate processors. Each separate processor can include a single processing unit, a multicore processing unit, or a combination. The processing unit can be a primary processor such as a CPU (central processing unit), a peripheral processor such as a GPU (graphics processing unit), or a combination. Memory accesses may also be initiated by devices such as a network controller or hard disk controller. Such devices can be integrated with the processor in some systems or attached to the processor via a bus (e.g., PCI express), or a combination. System 100 can be implemented as an SOC (system on a chip), or be implemented with standalone components.

Reference to memory devices can apply to different memory types. Memory devices often refers to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR3 (double data rate version 3, original release by JEDEC (Joint Electronic Device Engineering Council) on Jun. 27, 2007, currently on release 21), DDR4 (DDR version 4, initial specification published in September 2012 by JEDEC), LPDDR3 (low power DDR version 3, JESD209-3B, August 2013 by JEDEC), LPDDR4 (low power DDR version 4, JESD209-4, originally published by JEDEC in August 2014), WIO2 (Wide I/O 2 (WideIO2), JESD229-2, originally published by JEDEC in August 2014), HBM (high bandwidth memory DRAM, JESD235, originally published by JEDEC in October 2013), DDR5 (DDR version 5, currently in discussion by JEDEC), LPDDR5 (currently in discussion by JEDEC), HBM2 ((HBM version 2), currently in discussion by JEDEC), or others or combinations of memory technologies, and technologies based on derivatives or extensions of such specifications.

In addition to, or alternatively to, volatile memory, in one embodiment, reference to memory devices can refer to a nonvolatile memory device whose state is determinate even if power is interrupted to the device. In one embodiment, the nonvolatile memory device is a block addressable memory device, such as NAND or NOR technologies. Thus, a memory device can also include a future generation nonvolatile devices, such as a three dimensional crosspoint memory device, other byte addressable nonvolatile memory devices, or memory devices that use chalcogenide phase change material (e.g., chalcogenide glass). In one embodiment, the memory device can be or include multi-threshold level NAND flash memory, NOR flash memory, single or multi-level phase change memory (PCM) or phase change memory with a switch (PCMS), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

Descriptions herein referring to a "RAM" or "RAM device" can apply to any memory device that allows random access, whether volatile or nonvolatile. Descriptions referring to a "DRAM" or a "DRAM device" can refer to a volatile random access memory device. The memory device or DRAM can refer to the die itself, to a packaged memory product that includes one or more dies, or both. In one embodiment, a system with volatile memory that needs to be refreshed can also include nonvolatile memory.

Memory controller 120 represents one or more memory controller circuits or devices for system 100. Memory controller 120 represents control logic that generates memory access commands in response to the execution of operations by processor 110. Memory controller 120 accesses one or more memory devices 140. Memory devices 140 can be DRAM devices in accordance with any referred to above. In one embodiment, memory devices 140 are organized and managed as different channels, where each channel couples to buses and signal lines that couple to multiple memory devices in parallel. Each channel is independently operable. Thus, each channel is independently accessed and controlled, and the timing, data transfer, command and address exchanges, and other operations are separate for each channel. Coupling can refer to an electrical coupling, communicative coupling, physical coupling, or a combination of these. Physical coupling can include direct contact. Electrical coupling includes an interface or interconnection that allows electrical flow between components, or allows signaling between components, or both. Communicative coupling includes connections, including wired or wireless, that enable components to exchange data.

In one embodiment, settings for each channel are controlled by separate mode registers or other register settings. In one embodiment, each memory controller 120 manages a separate memory channel, although system 100 can be configured to have multiple channels managed by a single controller, or to have multiple controllers on a single channel. In one embodiment, memory controller 120 is part of host processor 110, such as logic implemented on the same die or implemented in the same package space as the processor.

Memory controller 120 includes I/O interface logic 122 to couple to a memory bus, such as a memory channel as referred to above. I/O interface logic 122 (as well as I/O interface logic 142 of memory device 140) can include pins, pads, connectors, signal lines, traces, or wires, or other hardware to connect the devices, or a combination of these. I/O interface logic 122 can include a hardware interface. As illustrated, I/O interface logic 122 includes at least drivers/transceivers for signal lines. Commonly, wires within an integrated circuit interface couple with a pad, pin, or connector to interface signal lines or traces or other wires between devices. I/O interface logic 122 can include drivers, receivers, transceivers, or termination, or other circuitry or combinations of circuitry to exchange signals on the signal lines between the devices. The exchange of signals includes at least one of transmit or receive. While shown as coupling I/O 122 from memory controller 120 to I/O 142 of memory device 140, it will be understood that in an implementation of system 100 where groups of memory devices 140 are accessed in parallel, multiple memory devices can include I/O interfaces to the same interface of memory controller 120. In an implementation of system 100 including one or more memory modules 170, I/O 142 can include interface hardware of the memory module in addition to interface hardware on the memory device itself. Other memory controllers 120 will include separate interfaces to other memory devices 140.

The bus between memory controller 120 and memory devices 140 can be implemented as multiple signal lines coupling memory controller 120 to memory devices 140. The bus may typically include at least clock (CLK) 132, command/address (CMD) 134, and write data (DQ) and read data (DQ) 136, and zero or more other signal lines 138. In one embodiment, a bus or connection between memory controller 120 and memory can be referred to as a memory bus. The signal lines for CMD can be referred to as a "C/A bus" (or ADD/CMD bus, or some other designation indicating the transfer of commands (C or CMD) and address (A or ADD) information) and the signal lines for write and read DQ can be referred to as a "data bus." In one embodiment, independent channels have different clock signals, C/A buses, data buses, and other signal lines. Thus, system 100 can be considered to have multiple "buses," in the sense that an independent interface path can be considered a separate bus. It will be understood that in addition to the lines explicitly shown, a bus can include at least one of strobe signaling lines, alert lines, auxiliary lines, or other signal lines, or a combination. It will also be understood that serial bus technologies can be used for the connection between memory controller 120 and memory devices 140. An example of a serial bus technology is 8B10B encoding and transmission of high-speed data with embedded clock over a single differential pair of signals in each direction. In one embodiment, CMD 134 represents signal lines shared in parallel with multiple memory devices. In one embodiment, multiple memory devices share encoding command signal lines of CMD 134, and each has a separate chip select (CS_n) signal line to select individual memory devices.

It will be understood that in the example of system 100, the bus between memory controller 120 and memory devices 140 includes a subsidiary command bus CMD 134 and a subsidiary bus to carry the write and read data, DQ 136. In one embodiment, the data bus can include bidirectional lines for read data and for write/command data. In another embodiment, the subsidiary bus DQ 136 can include unidirectional write signal lines for write and data from the host to memory, and can include unidirectional lines for read data from the memory to the host. In accordance with the chosen memory technology and system design, other signals 138 may accompany a bus or sub bus, such as strobe lines DQS. Based on design of system 100, or implementation if a design supports multiple implementations, the data bus can have more or less bandwidth per memory device 140. For example, the data bus can support memory devices that have either a x32 interface, a x16 interface, a x8 interface, or other interface. The convention "xW," where W is an integer that refers to an interface size or width of the interface of memory device 140, which represents a number of signal lines to exchange data with memory controller 120. The interface size of the memory devices is a controlling factor on how many memory devices can be used concurrently per channel in system 100 or coupled in parallel to the same signal lines. In one embodiment, high bandwidth memory devices, wide interface devices, or stacked memory configurations, or combinations, can enable wider interfaces, such as a x128 interface, a x256 interface, a x512 interface, a x1024 interface, or other data bus interface width.

In one embodiment, memory devices 140 and memory controller 120 exchange data over the data bus in a burst, or a sequence of consecutive data transfers. The burst corresponds to a number of transfer cycles, which is related to a bus frequency. In one embodiment, the transfer cycle can be a whole clock cycle for transfers occurring on a same clock or strobe signal edge (e.g., on the rising edge). In one embodiment, every clock cycle, referring to a cycle of the system clock, is separated into multiple unit intervals (UIs), where each UI is a transfer cycle. For example, double data rate transfers trigger on both edges of the clock signal (e.g., rising and falling). A burst can last for a configured number of UIs, which can be a configuration stored in a register, or triggered on the fly. For example, a sequence of eight consecutive transfer periods can be considered a burst length 8 (BL8), and each memory device 140 can transfer data on each UI. Thus, a x8 memory device operating on BL8 can transfer 64 bits of data (8 data signal lines times 8 data bits transferred per line over the burst). It will be understood that this simple example is merely an illustration and is not limiting.

Memory devices 140 represent memory resources for system 100. In one embodiment, each memory device 140 is a separate memory die. In one embodiment, each memory device 140 can interface with multiple (e.g., 2) channels per device or die. Each memory device 140 includes I/O interface logic 142, which has a bandwidth determined by the implementation of the device (e.g., x16 or x8 or some other interface bandwidth). I/O interface logic 142 enables the memory devices to interface with memory controller 120. I/O interface logic 142 can include a hardware interface, and can be in accordance with I/O 122 of memory controller, but at the memory device end. In one embodiment, multiple memory devices 140 are connected in parallel to the same command and data buses. In another embodiment, multiple memory devices 140 are connected in parallel to the same command bus, and are connected to different data buses. For example, system 100 can be configured with multiple memory devices 140 coupled in parallel, with each memory device responding to a command, and accessing memory resources 160 internal to each. For a Write operation, an individual memory device 140 can write a portion of the overall data word, and for a Read operation, an individual memory device 140 can fetch a portion of the overall data word. As non-limiting examples, a specific memory device can provide or receive, respectively, 8 bits of a 128-bit data word for a Read or Write transaction, or 8 bits or 16 bits (depending for a x8 or a x16 device) of a 256-bit data word. The remaining bits of the word will be provided or received by other memory devices in parallel.

In one embodiment, memory devices 140 are disposed directly on a motherboard or host system platform (e.g., a PCB (printed circuit board) on which processor 110 is disposed) of a computing device. In one embodiment, memory devices 140 can be organized into memory modules 170. In one embodiment, memory modules 170 represent dual inline memory modules (DIMMs). In one embodiment, memory modules 170 represent other organization of multiple memory devices to share at least a portion of access or control circuitry, which can be a separate circuit, a separate device, or a separate board from the host system platform. Memory modules 170 can include multiple memory devices 140, and the memory modules can include support for multiple separate channels to the included memory devices disposed on them. In another embodiment, memory devices 140 may be incorporated into the same package as memory controller 120, such as by techniques such as multi-chip-module (MCM), package-on-package, through-silicon via (TSV), or other techniques or combinations. Similarly, in one embodiment, multiple memory devices 140 may be incorporated into memory modules 170, which themselves may be incorporated into the same package as memory controller 120. It will be appreciated that for these and other embodiments, memory controller 120 may be part of host processor 110.

Memory devices 140 each include memory resources 160. Memory resources 160 represent individual arrays of memory locations or storage locations for data. Typically memory resources 160 are managed as rows of data, accessed via wordline (rows) and bitline (individual bits within a row) control. Memory resources 160 can be organized as separate channels, ranks, and banks of memory. Channels may refer to independent control paths to storage locations within memory devices 140. Ranks may refer to common locations across multiple memory devices (e.g., same row addresses within different devices). Banks may refer to arrays of memory locations within a memory device 140. In one embodiment, banks of memory are divided into sub-banks with at least a portion of shared circuitry (e.g., drivers, signal lines, control logic) for the sub-banks, allowing separate addressing and access. It will be understood that channels, ranks, banks, sub-banks, bank groups, or other organizations of the memory locations, and combinations of the organizations, can overlap in their application to physical resources. For example, the same physical memory locations can be accessed over a specific channel as a specific bank, which can also belong to a rank. Thus, the organization of memory resources will be understood in an inclusive, rather than exclusive, manner.

In one embodiment, memory devices 140 include one or more registers 144. Register 144 represents one or more storage devices or storage locations that provide configuration or settings for the operation of the memory device. In one embodiment, register 144 can provide a storage location for memory device 140 to store data for access by memory controller 120 as part of a control or management operation. In one embodiment, register 144 includes one or more Mode Registers. In one embodiment, register 144 includes one or more multipurpose registers. The configuration of locations within register 144 can configure memory device 140 to operate in different "modes," where command information can trigger different operations within memory device 140 based on the mode. Additionally or in the alternative, different modes can also trigger different operation from address information or other signal lines depending on the mode. Settings of register 144 can indicate configuration for I/O settings (e.g., timing, termination or ODT (on-die termination) 146, driver configuration, or other I/O settings).

In one embodiment, memory device 140 includes ODT 146 as part of the interface hardware associated with I/O 142. ODT 146 can be configured as mentioned above, and provide settings for impedance to be applied to the interface to specified signal lines. In one embodiment, ODT 146 is applied to DQ signal lines. In one embodiment, ODT 146 is applied to command signal lines. In one embodiment, ODT 146 is applied to address signal lines. In one embodiment, ODT 146 can be applied to any combination of the preceding. The ODT settings can be changed based on whether a memory device is a selected target of an access operation or a non-target device. ODT 146 settings can affect the timing and reflections of signaling on the terminated lines. Careful control over ODT 146 can enable higher-speed operation with improved matching of applied impedance and loading. ODT 146 can be applied to specific signal lines of I/O interface 142, 122, and is not necessarily applied to all signal lines.

Memory device 140 includes controller 150, which represents control logic within the memory device to control internal operations within the memory device. For example, controller 150 decodes commands sent by memory controller 120 and generates internal operations to execute or satisfy the commands. Controller 150 can be referred to as an internal controller, and is separate from memory controller 120 of the host. Controller 150 can determine what mode is selected based on register 144, and configure the internal execution of operations for access to memory resources 160 or other operations based on the selected mode. Controller 150 generates control signals to control the routing of bits within memory device 140 to provide a proper interface for the selected mode and direct a command to the proper memory locations or addresses. Controller 150 includes command logic 152, which can decode command encoding received on command and address signal lines. Thus, command logic 152 can be or include a command decoder. With command logic 152, memory device can identify commands and generate internal operations to execute requested commands.

Referring again to memory controller 120, memory controller 120 includes command (CMD) logic 124, which represents logic or circuitry to generate commands to send to memory devices 140. The generation of the commands can refer to the command prior to scheduling, or the preparation of queued commands ready to be sent. Generally, the signaling in memory subsystems includes address information within or accompanying the command to indicate or select one or more memory locations where the memory devices should execute the command. In response to scheduling of transactions for memory device 140, memory controller 120 can issue commands via I/O 122 to cause memory device 140 to execute the commands. In one embodiment, controller 150 of memory device 140 receives and decodes command and address information received via I/O 142 from memory controller 120. Based on the received command and address information, controller 150 can control the timing of operations of the logic and circuitry within memory device 140 to execute the commands. Controller 150 is responsible for compliance with standards or specifications within memory device 140, such as timing and signaling requirements. Memory controller 120 can implement compliance with standards or specifications by access scheduling and control.

Memory controller 120 includes scheduler 130, which represents logic or circuitry to generate and order transactions to send to memory device 140. From one perspective, the primary function of memory controller 120 could be said to schedule memory access and other transactions to memory device 140. Such scheduling can include generating the transactions themselves to implement the requests for data by processor 110 and to maintain integrity of the data (e.g., such as with commands related to refresh). Transactions can include one or more commands, and result in the transfer of commands or data or both over one or multiple timing cycles such as clock cycles or unit intervals. Transactions can be for access such as read or write or related commands or a combination, and other transactions can include memory management commands for configuration, settings, data integrity, or other commands or a combination.

Memory controller 120 typically includes logic such as scheduler 130 to allow selection and ordering of transactions to improve performance of system 100. Thus, memory controller 120 can select which of the outstanding transactions should be sent to memory device 140 in which order, which is typically achieved with logic much more complex that a simple first-in first-out algorithm. Memory controller 120 manages the transmission of the transactions to memory device 140, and manages the timing associated with the transaction. In one embodiment, transactions have deterministic timing, which can be managed by memory controller 120 and used in determining how to schedule the transactions with scheduler 130.

In one embodiment, memory controller 120 includes refresh (REF) logic 126. Refresh logic 126 can be used for memory resources that are volatile and need to be refreshed to retain a deterministic state. In one embodiment, refresh logic 126 indicates a location for refresh, and a type of refresh to perform. Refresh logic 126 can trigger self-refresh within memory device 140, or execute external refreshes which can be referred to as auto refresh commands) by sending refresh commands, or a combination. In one embodiment, system 100 supports all bank refreshes as well as per bank refreshes. All bank refreshes cause the refreshing of banks within all memory devices 140 coupled in parallel. Per bank refreshes cause the refreshing of a specified bank within a specified memory device 140. In one embodiment, controller 150 within memory device 140 includes refresh logic 154 to apply refresh within memory device 140. In one embodiment, refresh logic 154 generates internal operations to perform refresh in accordance with an external refresh received from memory controller 120. Refresh logic 154 can determine if a refresh is directed to memory device 140, and what memory resources 160 to refresh in response to the command.

In an embodiment, memory controller 120 includes I/O training logic 128. I/O training logic 128 refers to logic in the memory controller to execute training of I/O interconnections between memory controller 120 and memory devices 140. Training can refer to the application of different settings to determine a setting that provides improved signaling quality. Training can include iterative operation to test different settings, which can include voltage settings, timing settings, or other settings, or a combination. I/O training logic 128 can set the parameters associated with transceivers of I/O 142 and I/O 122. In one embodiment, I/O training logic 128 enables separate CS signal training. Separate CS training refers to training that is executed separately from training of other command signals on the C/A bus or command bus 134.

Training can refer to the testing and setting of electrical parameters or timing parameters or both that control a data signal eye. The data signal eye refers to timing and shape of rising and falling edges, on average, for a signal. The height and width of the eye provides compliance with timing and voltage level requirements needed to trigger a logic value on the signal line or a change in logic value, or both. The CS training can be in accordance with any embodiment of CS training described herein. In one embodiment, I/O training logic 128 provides for a CS training mode in accordance with any embodiment described herein. In one embodiment, I/O training logic 128 is part of command logic 124.

In an embodiment, memory devices 140 include I/O sampling and feedback logic 180. Logic 180 of memory devices 140 is counterpart logic to I/O training logic 128. I/O training logic 128 can enable the testing of various signaling parameters to test the signaling of various signal lines in the interface between memory controller 120 and memory devices 140. Logic 180 samples signal lines for the testing and provides feedback to the memory controller to identify what settings provide signaling characteristics that will enable the devices to exchange information, such as commands from the memory controller and data.

In one embodiment, based on a command from command logic 124, memory device 140 can enter a CSTM mode. The CSTM mode enables system 100 to train a chip select signal (not specifically shown) separately from training of command bus 134. With memory device 140 in the CSTM mode, memory controller 120 can send commands to memory device 140 to train voltage margining or timing margining or phase margining or a combination (which can collectively be referred to as signal margining) for the CS signal line to align chip select signaling with the memory subsystem clock signal of clock signal 132.

Figure 2:
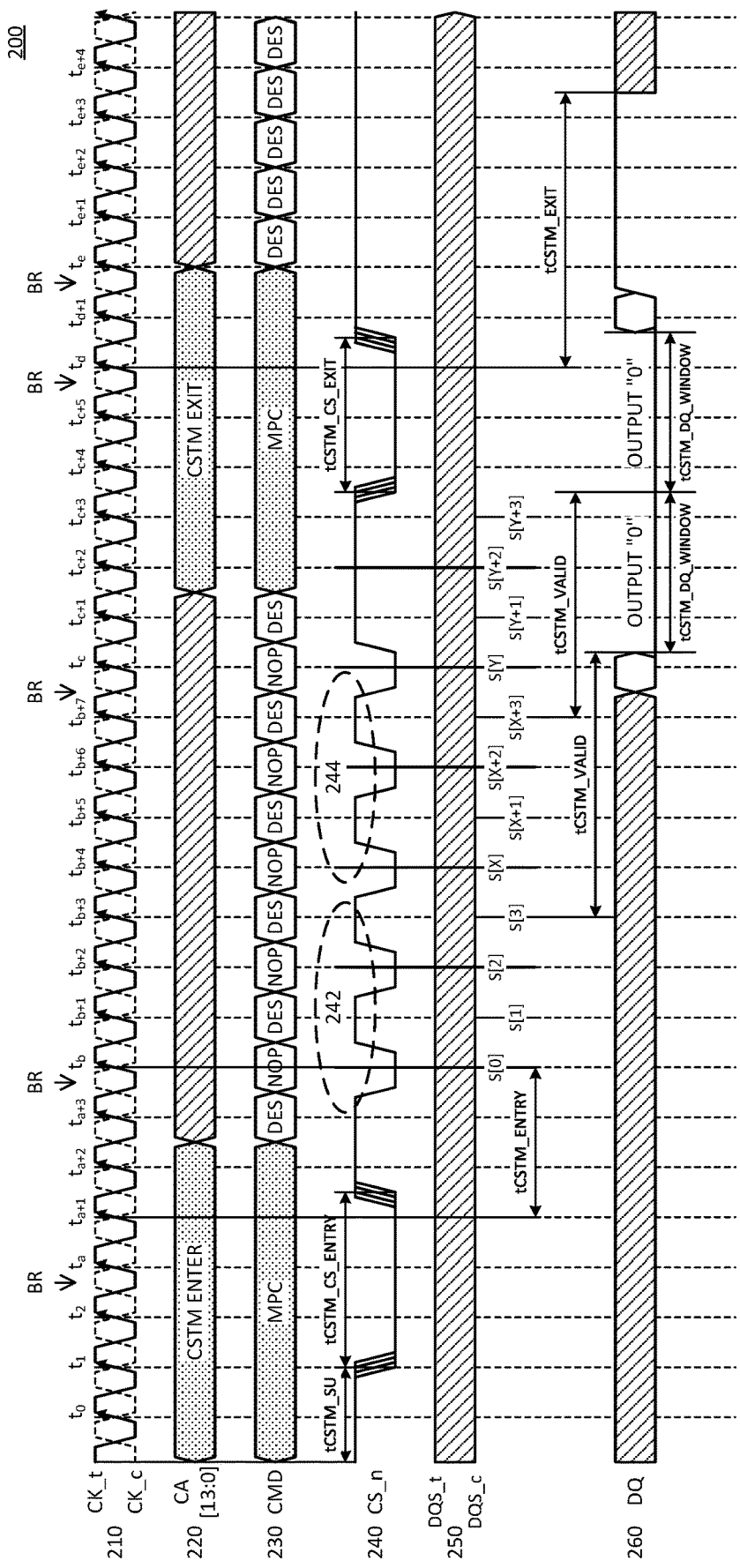
FIG. 2 is a timing diagram of an embodiment of a chip select training mode with consecutive output samples equal to zero.

FIG. 2 is a timing diagram of an embodiment of a chip select training mode with consecutive output samples equal to zero. Diagram 200 illustrates an example of CS training timing in accordance with an embodiment of system 100. Signal line 210 illustrates a clock signal, which can include a primary clock signal CK_t, and a complementary clock signal CK_c. In one embodiment, in the CSTM mode, the clock signal of the I/O circuitry runs continuously. The timing illustrates different timing indicators, such as t0, t1, . . . , t(a+1), t(a+2), . . . , and so forth. The different sections of timing indicate timing that is not necessarily contiguous, although it may be. There are multiple breaks (BR) illustrated. The breaks are representative only. In one embodiment, CS training can establish alignment between the CK signal 210 and CS_n signal 240.

Signal 220 illustrates the command bus (CA), which can include 14 signal lines as illustrated. The number of signal lines is for example only. In one embodiment, the memory controller enables CSTM by sending an MPC command with the opcode for CSTM Entry. Signal 220 illustrates a CSTM enter command (around approximately t0), and a CSTM exit command (around approximately t(c+1)). Signal 230 illustrates the command that will be decoded based on the signals of CA signal 220. In one embodiment, CSTM enter is controlled by an MPC (multipurpose command), which can be issued by writing a multipurpose register of a mode register. The CSTM enter command can be triggered by writing a specific bit pattern to the multipurpose register. In one embodiment, prior to entering CSTM, the memory device maintains the DQ signal lines tri-stated.

In one embodiment, the MPC command extends beyond multiple tCK cycles, during which the CS_n signal is asserted. In one embodiment, when the DRAM device is in CSTM, commands are still actively processed. In one embodiment, the only commands that should be sent by the host memory controller while CSTM is enabled are the NOP command and the MPC to exit CSTM. It will be understood that other commands sent and processed prior to training may produce unreliable results. In one embodiment, during the CSTM mode, the memory controller holds or maintains the signal lines of CA signal 220 at a NOP (no operation) command encoding. As seen in signal 230, the difference between a NOP command and a DES or deselect command is the assertion or deassertion of the chip select line.

Signal 250 represents a data strobe signal (DQS), which can include complementary DQS_t and DQS_c signals. The specific signaling of the data strobe is not limiting on diagram 200. Signal 240 represents a chip select signal for the memory device, where the DRAM can obtain multiple samples. In one embodiment, once the DRAM has CSTM enabled, the DRAM device begins sampling on every rising CK edge, starting with a rising edge of clock signal 210 after a delay of tCSTM_Entry, which represents a delay period that can begin after a tCSTM_CS_Entry, which in turn initiates after a delay of tCSTM_SU. In one embodiment, the DRAM device samples CS_n with groups of four samples each. In one embodiment, the sampling of 4-sample groups loops consecutively. Depending on the values of the samples, the memory device drives the DQ signal 260 high or low. Thus, diagram 200 illustrates samples S[0:3], S[X:X+3], and S[Y:Y+3], as 4-sample groups. More or fewer samples can be used in alternate implementations. In one embodiment, the system considers samples as primary samples and secondary samples. The primary samples are illustrated by the solid lines. The even samples (S[0], S[2], and so forth) can be considered the primary samples in diagram 200, although it will be understood that such a designation can be arbitrary, and the initiation of sampling can begin at an arbitrary time.

As illustrated, the delay from when the CS signals are sampled during the fourth CK rising edge (sample S[3]) to when the output of the sample evaluation is driven to a stable value on the DQ pins or signal lines of DQ signal 260 is specified as tCSTM_Valid. There is likewise another delay period of tCSTM_Valid between sample S[X+3] and a second output. The time period tCSTM_DQ_Window represents a period of time during which the memory device drives the output result of the sampling on DQ signal 260, and can be shorter or longer than what is illustrated, depending on the system configuration. The memory device drives the outputs as either zero or one depending on the transition of samples.

In one embodiment, for the sampling at 242, the primary samples S[0] and S[2] are logic low, and the secondary samples S[1] and S[3] are logic high, creating a results output of zero. At the sampling at 244, the primary samples S[X] and S[X+2] are likewise logic low, and the secondary samples S[X+1] and S[X+3] are logic high, creating a results output of zero.

In one embodiment, to exit CSTM, the memory controller sends an MPC command to disable CSTM. In one embodiment, since the timing relationship between CS_n and CK is understood when exiting CSTM, the memory controller or host can either send a multicycle CS_n assertion during the MPC command or a single tCK assertion. The exiting of CSTM may have an associated exit delay of tCSTM_Exit, as illustrated.

Figure 3:
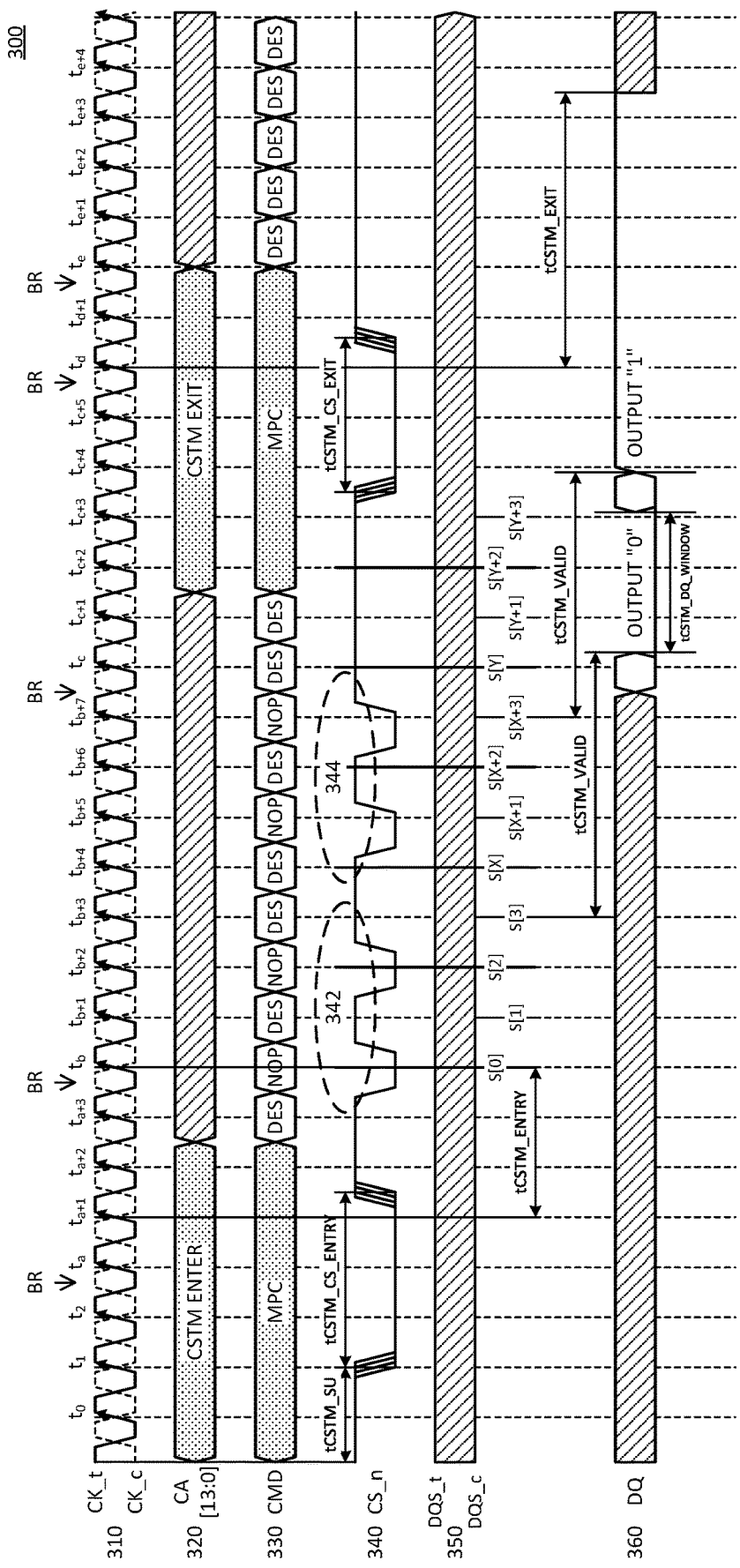
FIG. 3 is a timing diagram of an embodiment of a chip select training mode with output sample toggle.

FIG. 3 is a timing diagram of an embodiment of a chip select training mode with output sample toggle. Diagram 300 illustrates an example of CS training timing in accordance with an embodiment of system 100, and is similar to diagram 200, but with a different CS transition in the sampling. Signal line 310 illustrates a clock signal, which can include a primary clock signal CK_t, and a complementary clock signal CK_c. In one embodiment, in the CSTM mode, the clock signal of the I/O circuitry runs continuously. The timing illustrates different timing indicators, such as t0, t1, . . . , t(a+1), t(a+2), . . . , and so forth. The different sections of timing indicate timing that is not necessarily contiguous, although it may be. There are multiple breaks (BR) illustrated. The breaks are representative only. In one embodiment, CS training can establish alignment between the CK signal 310 and CS_n signal 340.

Signal 320 illustrates the command bus (CA), which can include 14 signal lines as illustrated. The number of signal lines is for example only. In one embodiment, the memory controller enables CSTM by sending an MPC command with the opcode for CSTM Entry. Signal 320 illustrates a CSTM enter command (around approximately t0), and a CSTM exit command (around approximately t(c+1)). Signal 330 illustrates the command that will be decoded based on the signals of CA signal 320. In one embodiment, CSTM enter is controlled by an MPC (multipurpose command), which can be issued by writing a multipurpose register of a mode register. The CSTM enter command can be triggered by writing a specific bit pattern to the multipurpose register. In one embodiment, prior to entering CSTM, the memory device maintains the DQ signal lines tri-stated.

In one embodiment, the MPC command extends beyond multiple tCK cycles, during which the CS_n signal is asserted. In one embodiment, when the DRAM device is in CSTM, commands are still actively processed. In one embodiment, the only commands that should be sent by the host memory controller while CSTM is enabled are the NOP command and the MPC to exit CSTM. It will be understood that other commands sent and processed prior to training may produce unreliable results. In one embodiment, during the CSTM mode, the memory controller holds or maintains the signal lines of CA signal 220 at a NOP (no operation) command encoding. As seen in signal 330, the difference between a NOP command and a DES or deselect command is the assertion or deassertion of the chip select line.

Signal 350 represents a data strobe signal (DQS), which can include complementary DQS_t and DQS_c signals. The specific signaling of the data strobe is not limiting on diagram 300. Signal 340 represents a chip select signal for the memory device, where the DRAM can obtain multiple samples. In one embodiment, once the DRAM has CSTM enabled, the DRAM device begins sampling on every rising CK edge, starting with a rising edge of clock signal 310 after a delay of tCSTM_Entry, which represents a delay period that can begin after a tCSTM_CS_Entry, which in turn initiates after a delay of tCSTM_SU. In one embodiment, the DRAM device samples CS_n with groups of four samples each. In one embodiment, the sampling of 4-sample groups loops consecutively. Depending on the values of the samples, the memory device drives the DQ signal 360 high or low. Thus, diagram 300 illustrates samples S[0:3], S[X:X+3], and S[Y:Y+3], as 4-sample groups. More or fewer samples can be used in alternate implementations. In one embodiment, the system considers samples as primary samples and secondary samples. The primary samples are illustrated by the solid lines. The even samples (S[0], S[2], and so forth) can be considered the primary samples in diagram 200, although it will be understood that such a designation can be arbitrary, and the initiation of sampling can begin at an arbitrary time.

As illustrated, the delay from when the CS signals are sampled during the fourth CK rising edge (sample S[3]) to when the output of the sample evaluation is driven to a stable value on the DQ pins or signal lines of DQ signal 260 is specified as tCSTM_Valid. There is likewise another delay period of tCSTM_Valid between sample S[X+3] and a second output. The time period tCSTM_DQ_Window represents a period of time during which the memory device drives the output result of the sampling on DQ signal 360, and can be shorter or longer than what is illustrated, depending on the system configuration. The memory device drives the outputs as either zero or one depending on the transition of samples.

In one embodiment, for the sampling at 342, the primary samples S[0] and S[2] are logic low, and the secondary samples S[1] and S[3] are logic high, creating a results output of zero. At the sampling at 344, the primary samples S[X] and S[X+2] are logic high, and the secondary samples S[X+1] and S[X+3] are logic low, creating a results output of one.

In one embodiment, to exit CSTM, the memory controller sends an MPC command to disable CSTM. In one embodiment, since the timing relationship between CS_n and CK is understood when exiting CSTM, the memory controller or host can either send a multicycle CS_n assertion during the MPC command or a single tCK assertion. The exiting of CSTM may have an associated exit delay of tCSTM_Exit, as illustrated.

Figure 4:
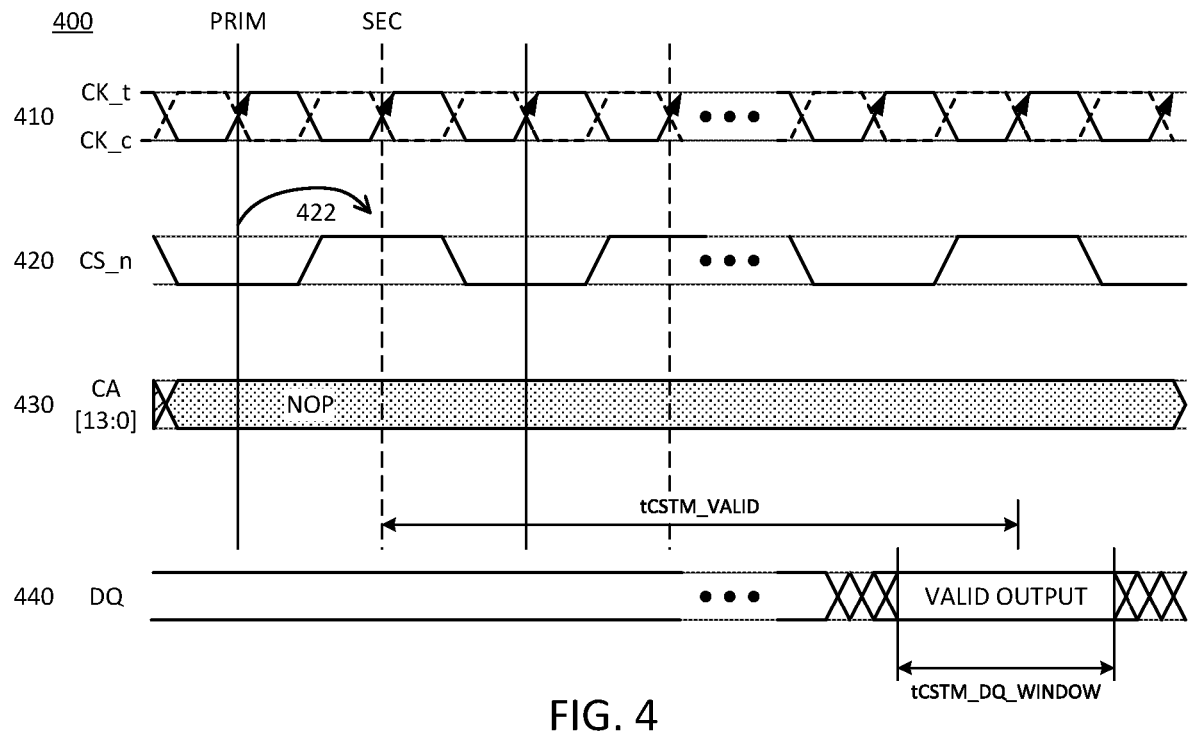
FIG. 4 is a timing diagram of an embodiment of timing for chip select training mode 0 sample.

FIG. 4 is a timing diagram of an embodiment of timing for chip select training mode 0 sample. The mode 0 sample of diagram 400 assumes that transition 422 from logic low to logic high results in a zero output. It will be understood that in an alternate embodiment the orientation could be reversed. Diagram 400 illustrates an example of outputting a zero in response to sampling a CS signal in CS training in accordance with one embodiment of CSTM for system 100.

Signal 410 represents a clock signal, and illustrates the rising edges of the clock. Signal 420 represents a chip select signal that is being sampled for training. Signal 430 represents the command bus signal. In one embodiment, the signal encoding is held at a NOP during the CSTM mode. Signal 440 represents the DQ signal line. In one embodiment, the delay from when the CS signals are sampled during the secondary CK rising edge and the timing for when the output of the sample evaluation is driven to a stable value on the DQ pins is specified as tCSTM_Valid. The valid output can be outputted for a period of tCSTM_DQ_Window.

In one embodiment, the primary sample (the dark line) is a logic zero and the secondary sample (the dashed line) is a logic one. Thus, transition 422 of CS sample In accordance with an embodiment of diagram 400, a CS sample of '01' results in an output of zero. In one embodiment, the output is a logic 0 on all signal lines of the data bus. In one embodiment, during CSTM the CA ODT is enabled as for functional operation. The VrefCA is set according to the functional setting (through the VrefCA Command). The timing requirements for the CA bus, CK, and CS_n are the same as for functional operation.

In one embodiment, the memory controller can change the timing of the CS signal in CSTM. For example, a logic one pulse can be held at a one for longer or shorter relative to a previous pulse or a subsequent pulse, or both. Thus, the timing can be adjusted to align the CS toggle timing for proper signaling. The timing can be adjusted by extending the trailing edge of the pulse or causing the trailing edge to be triggered sooner than another pulse.

Figure 5:
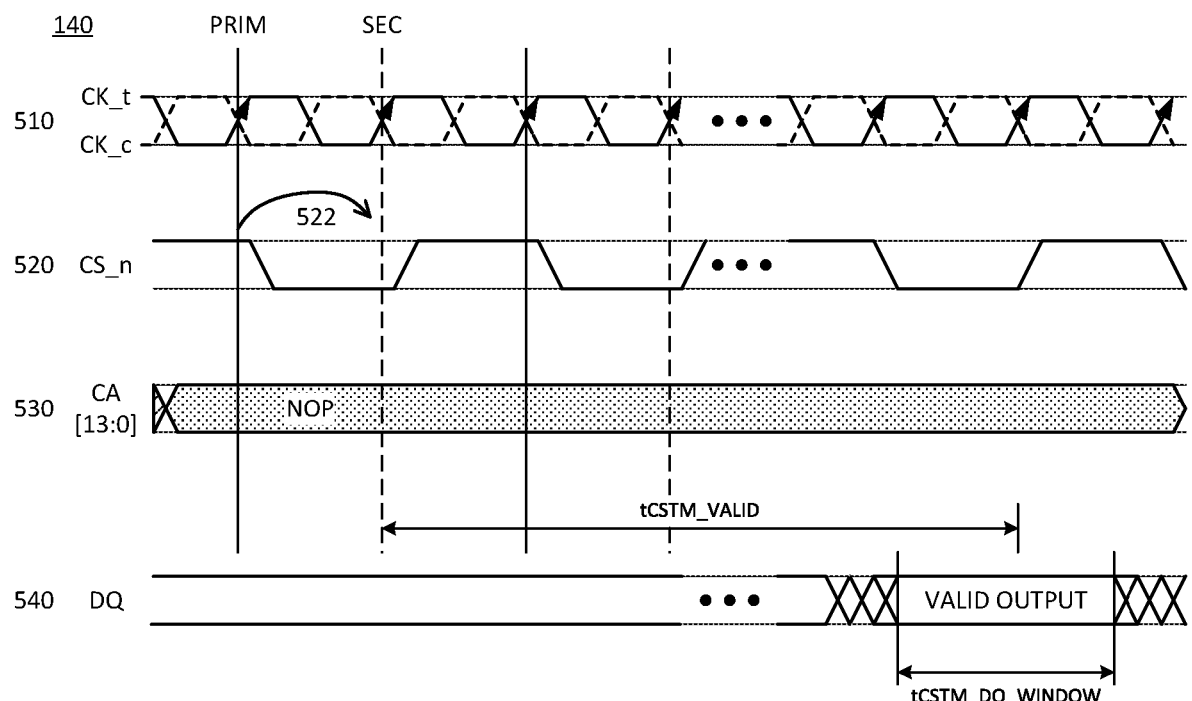
FIG. 5 is a timing diagram of an embodiment of timing for chip select training mode 1 sample.

FIG. 5 is a timing diagram of an embodiment of timing for chip select training mode 1 sample. Diagram 500 illustrates an example of outputting a one in response to sampling a CS signal in CS training in accordance with one embodiment of CSTM for system 100. In one embodiment, the primary sample (dark line) is a logic one and the secondary sample (the dashed line) is a logic zero. In accordance with an embodiment of diagram 600, a CS sample of '10' results in an output of one.

The mode 1 sample of diagram 500 assumes that transition 522 from logic high to logic low results in a one output. It will be understood that in an alternate embodiment the orientation could be reversed. Diagram 500 illustrates an example of outputting a one in response to sampling a CS signal in CS training in accordance with one embodiment of CSTM for system 100.

Signal 510 represents a clock signal, and illustrates the rising edges of the clock. Signal 520 represents a chip select signal that is being sampled for training. Signal 530 represents the command bus signal. In one embodiment, the signal encoding is held at a NOP during the CSTM mode. Signal 540 represents the DQ signal line. In one embodiment, the delay from when the CS signals are sampled during the secondary CK rising edge and the timing for when the output of the sample evaluation is driven to a stable value on the DQ pins is specified as tCSTM_Valid. The valid output can be outputted for a period of tCSTM_DQ_Window.

In one embodiment, the primary sample (the dark line) is a logic one and the secondary sample (the dashed line) is a logic zero. Thus, transition 522 of CS sample In accordance with an embodiment of diagram 500, a CS sample of '10' results in an output of one. In one embodiment, the output is a logic 1 on all signal lines of the data bus. In one embodiment, during CSTM the CA ODT is enabled as for functional operation. The VrefCA is set according to the functional setting (through the VrefCA Command). The timing requirements for the CA bus, CK, and CS_n are the same as for functional operation.

In one embodiment, the memory controller can change the timing of the CS signal in CSTM. For example, a logic one pulse can be held at a one for longer or shorter relative to a previous pulse or a subsequent pulse, or both. Thus, the timing can be adjusted to align the CS toggle timing for proper signaling. The timing can be adjusted by extending the trailing edge of the pulse or causing the trailing edge to be triggered sooner than another pulse.

FIG. 6 is a representation of an embodiment of chip select training evaluation. Diagram 600 illustrates an example of output for CS training in accordance with an embodiment of system 100. In one embodiment, in CSTM, the CS_n values are sampled on all CK rising edges, with every other samples alternately considered primary samples and secondary samples. In one embodiment, the sample evaluation to determine the output is as in diagram 700.

As illustrated at row 602, CSTM Output can be set to '1' on a zero-to-zero transition between the primary sample (Primary CS_n_Sample) and the secondary sample (Secondary CS_n_Sample). As illustrated at row 604, CSTM Output can be set to '0' on a zero-to-one between the primary and secondary samples. As illustrated at row 606, CSTM Output can be set to '1' on a one-to-zero transition between the primary and secondary samples. As illustrated at row 608, CSTM Output can be set to '1' on a one-to-one transition between the primary and secondary samples.

FIG. 7 is a representation of an embodiment of sample evaluation for chip select training mode output. Diagrams 710, 720, and 730 illustrate examples of outputs for CS training in accordance with an embodiment of system 100, and in accordance with one embodiment of diagram 600 of FIG. 6. Whereas diagram 600 illustrates an embodiment of an output based on primary and secondary samples, diagrams 710, 720, and 730 illustrate a process of generating a final output based on using the same pattern of diagram 600, but for generating intermediate results, and then generating a final result from the intermediate results.

The CSTM operation can be described in one embodiment as follows. The CS_n values are sampled on all CK rising edges. In one embodiment, each group of four consecutive samples is evaluated in pairs, and then the two pairs are combined with a logical OR prior to sending to the DQ output. Thus, in one embodiment, the system evaluates the samples to determine the output is as follows: diagram 710 illustrates a table showing sample evaluation for intermediate Output[0]; diagram 720 illustrates a table showing sample evaluation for intermediate Output[1]; and, diagram 730 illustrates a table showing sample evaluation for final CSTM Output.

Referring to table 710, as illustrated at row 712, Output[0] can be set to '1' on a zero-to-zero transition when the primary sample (CS_n_SAMPLE[0]) is 0 and the secondary sample (CS_n_SAMPLE[0]) is 0. As illustrated at row 714, Output[0] can be set to '0' on a zero-to-one transition when the primary sample (CS_n_SAMPLE[0]) is 0 and the secondary sample (CS_n_SAMPLE[0]) is 1. As illustrated at row 716, Output[0] can be set to '1' on a one-to-zero transition when the primary sample (CS_n_SAMPLE[0]) is 1 and the secondary sample (CS_n_SAMPLE[0]) is 0. As illustrated at row 718, Output[0] can be set to '1' on a one-to-one transition when the primary sample (CS_n_SAMPLE[0]) is 1 and the secondary sample (CS_n_SAMPLE[0]) is 1.

Referring to table 720, as illustrated at row 722, Output[1] can be set to '1' on a zero-to-zero transition when the primary sample (CS_n_SAMPLE[2]) is 0 and the secondary sample (CS_n_SAMPLE[3]) is 0. As illustrated at row 724, Output[1] can be set to '0' on a zero-to-one transition when the primary sample (CS_n_SAMPLE[2]) is 0 and the secondary sample (CS_n_SAMPLE[3]) is 1. As illustrated at row 726, Output[1] can be set to '1' on a one-to-zero transition when the primary sample (CS_n_SAMPLE[2]) is 1 and the secondary sample (CS_n_SAMPLE[3]) is 0. As illustrated at row 728, Output[1] can be set to '1' on a one-to-one transition when the primary sample (CS_n_SAMPLE[2]) is 1 and the secondary sample (CS_n_SAMPLE[3]) is 1.

Referring to table 730, as illustrated at row 732, CSTM Output can be set to '1' on a zero-to-zero transition between Output[0] and Output[1]. As illustrated at row 734, CSTM Output can be set to '0' on a zero-to-one between Output[0] and Output[1]. As illustrated at row 736, CSTM Output can be set to '1' on a one-to-zero transition between Output[0] and Output[1]. As illustrated at row 738, CSTM Output can be set to '1' on a one-to-one transition between Output[0] and Output[1].

In one embodiment, when there is no change on the CSTM Output from the previous evaluation, the memory device continues to drive the DQ bus with the same value continuously with no switching on the bus. In one embodiment, during CSTM mode, the CA ODT is enabled as for functional operation. In one embodiment, the VrefCA is set according to the functional setting (through the VrefCA Command).

FIG. 8 is a representation of an embodiment of AC parameters for a chip select training mode. Diagram 800 illustrates one example of AC parameters for a CSTM in accordance with any embodiment described herein. The AC parameters refer to the timing parameters for signaling on the signal lines. The signaling occurs with either rising or falling edges or both. The timing parameters refer to requirements to meet timing from one signal change to another, where a signal change triggers an operation by one or more circuit elements of the memory device. In one embodiment, multiple cycles are used to avoid possible metastability of CS_n. In one embodiment, at the end of CSTM, it is assumed that the host should be able to place the CS_n appropriately and the exit command could be issued as a single cycle command.

Row 802 identifies tCSTM_Entry, which represents a timing parameter that defines a delay or window or time between registration of the CSTM entry command and the start of obtaining samples for the training. Row 804 identifies tCSTM_Exit, which represents a timing parameter that defines a time between registration of the CSTM exit command and the end of the training mode. Row 806 identifies tCSTM_Valid, which represents a timing parameter from sample evaluation to output of the sample evaluation results on a data bus. For rows 802, 804, and 806, diagram 800 illustrates an example maximum time of 20 ns (nanoseconds).

Row 808 identifies tCSTM_DQ_Window, which represents a time that the output is available on the data bus. The time the output is available defines a window during which the host or memory controller can read the result. The illustrated example defines the minimum time available to be 2 CK or two clock cycles.

Row 810 identifies tCSTM_CS_Entry, which represents a time that the CS_n signal is held low to register an entry command. Row 812 identifies tCSTM_CS_Exit, which represents a time that the CS_n signal is held low to register an exit command. Reference to holding the CS_n signal low can refer to an operation by the host or memory controller to drive a logic low on the CS_n signal line. In the example of diagram 800, both parameters are illustrated as having a maximum time of 8 CK. The time tCSTM_CS_Entry is illustrated as having a minimum time of 3.5 CK.

Row 814 identifies tCSTM_SU, which represents a setup time for a transition from a command to a CS_n low signal. The time tCSTM_SU can refer to a time from the triggering of a command to when the CS_n signal goes low. In one embodiment, the phase or transition time can be controllable to take longer to go low, or to transition from low to high either slower or faster, similar to what is illustrated in signal 240 of diagram 200.

FIG. 9 is a representation of an embodiment of a chip select sample output per interface width. Diagram 900 provides one example of output signals in accordance with an embodiment of system 100. More particularly, diagram 900 illustrates an example of which signals will transmit the output of the CSTM mode loopback sample evaluation. In one embodiment, the values are driven asynchronously, but may switch as often as every 4 tCK. In one embodiment, the values may switch as often as every 2 tCK.

In one embodiment, the memory device provides output on all DQ signal lines in response to a CS training. Thus, a x4 device only includes DQ[3:0], and can provide CSTM Output on those data lines, in accordance with rows 902. As illustrated with rows 902 and 904, a x8 device can provide CSTM Output on DQ[7:0]. As illustrated with rows 902, 904, and 908, a x16 device can provide CSTM Output on DQ[15:0]. Rows 906 illustrated other potential data signal lines. In one embodiment, the memory device does not drive strobe or supplemental data signal lines when providing CSTM Output feedback. In addition to rows 906, rows 910 may be unused by the memory device to output CSTM Output.

Figure 10:
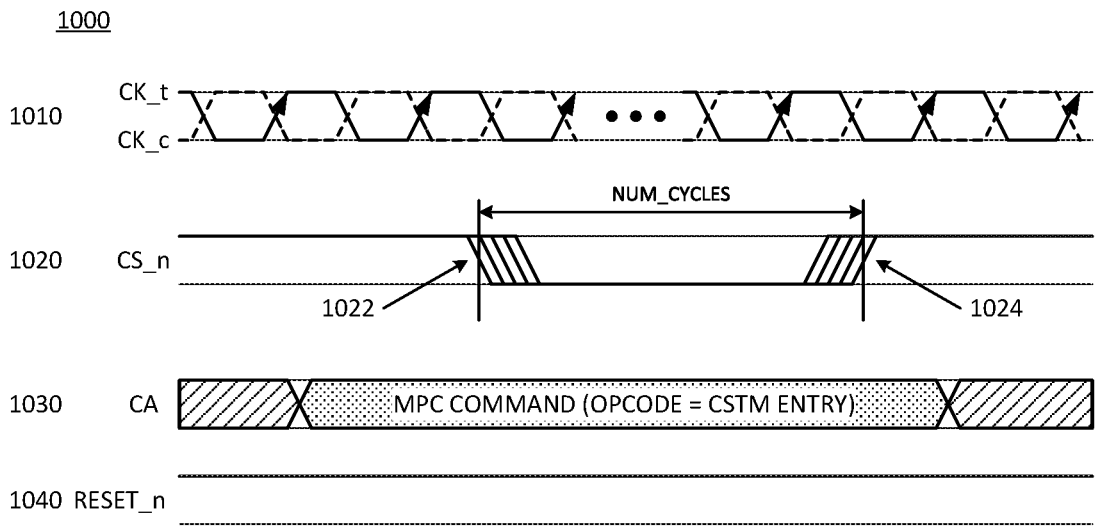
FIG. 10 is a timing diagram of an embodiment of timing of chip select training mode entry.

FIG. 10 is a timing diagram of an embodiment of timing of chip select training mode entry. Diagram 1000 illustrates an example of CS training mode entry in accordance with one embodiment of CSTM for system 100. In one embodiment, the CSTM entry of diagram 1000 is in accordance with a multicycle CS_n assertion. The CS training can establish alignment between CK signal 1010 and CS_n signal 1020. In one embodiment, CSTM is enabled when the host sends an MPC command with the opcode for CSTM Entry, as illustrated on command signal 1030. In one embodiment, Reset_n signal 1040 is held high during the CS training process.

In one embodiment, the MPC command extends beyond multiple tCK cycles, during which the CS_n signal is asserted. In one embodiment, commands can still be actively processed. It may be preferable to limit commands during CSTM to NOP command and the MPC to exit CSTM mode, seeing that other commands may produce unreliable results prior to proper CS alignment. In one embodiment, once the memory device has CSTM enabled, the memory device begins sampling on the primary and secondary rising CK edges. Depending on the value of the samples, the DQ signals are driven high or low. In one embodiment, prior to entering CSTM, the DQs remain tri-stated.

The CS training can align the chip select signal with the clock edges for improved signaling, based on improved sampling times of other signal lines. Area 1022 illustrates how the falling edge of CS_n signal 1020 can be adjusted in time or phase adjusted to transition to a logic low. Additionally, area 1024 illustrates how the rising edge of CS_n signal 1020 can be adjusted in time or phase adjusted to transition from low to high. The total time the signal is low can be a configured number of cycles, and the phase adjustments can align the signal to the clock edges.

Figure 11:
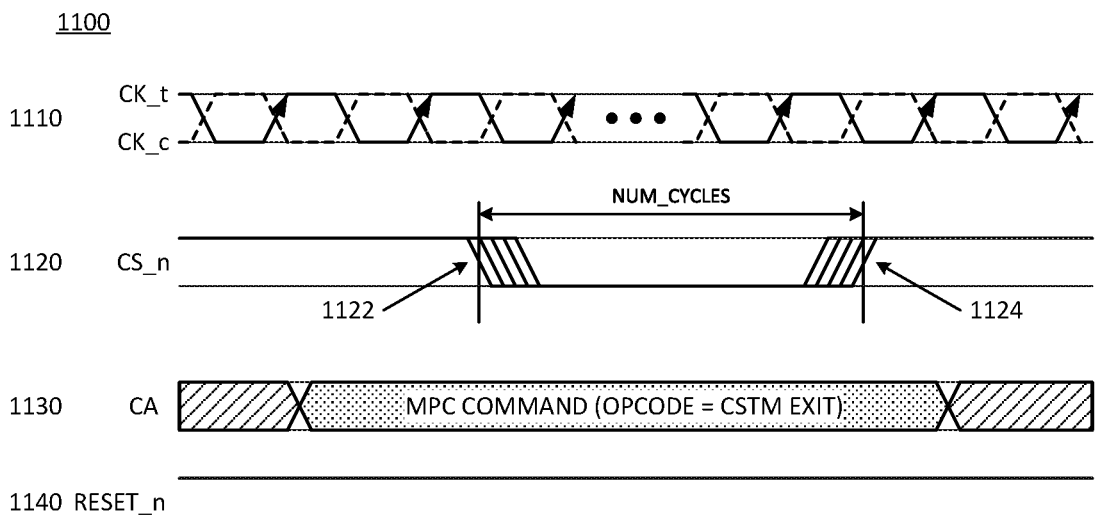
FIG. 11 is a timing diagram of an embodiment of timing of chip select training mode exit.

FIG. 11 is a timing diagram of an embodiment of timing of chip select training mode exit. Diagram 1100 illustrates an example of CS training mode exit in accordance with one embodiment of CSTM for system 100. Diagram 1100 is one example of an exit from a CSTM mode entered in accordance with diagram 1000. In one embodiment, the CS training mode exit of diagram 1100 is in accordance with a multicycle CS_n assertion.

In one embodiment, to exit CSTM, the host sends an MPC command with a CSTM Exit opcode, as illustrated on command signal 1130. The CSTM mode sets the alignment of CK signal 1110 with CS_n signal 1120, and therefore the timing relationship between CS_n and CK is understood when exiting the training mode. In one embodiment, the host can either send a multicycle CS_n assertion during the MPC command or a single tCK assertion to cause the exit. In one embodiment, Reset_n signal 1140 is held high during the CS training process.

Area 1122 illustrates how the falling edge of CS_n signal 1120 can be adjusted in time or phase adjusted to transition to a logic low. Additionally, area 1124 illustrates how the rising edge of CS_n signal 1120 can be adjusted in time or phase adjusted to transition from low to high. The total time the signal is low can be a configured number of cycles, and the phase adjustments can align the signal to the clock edges.

Figure 12:
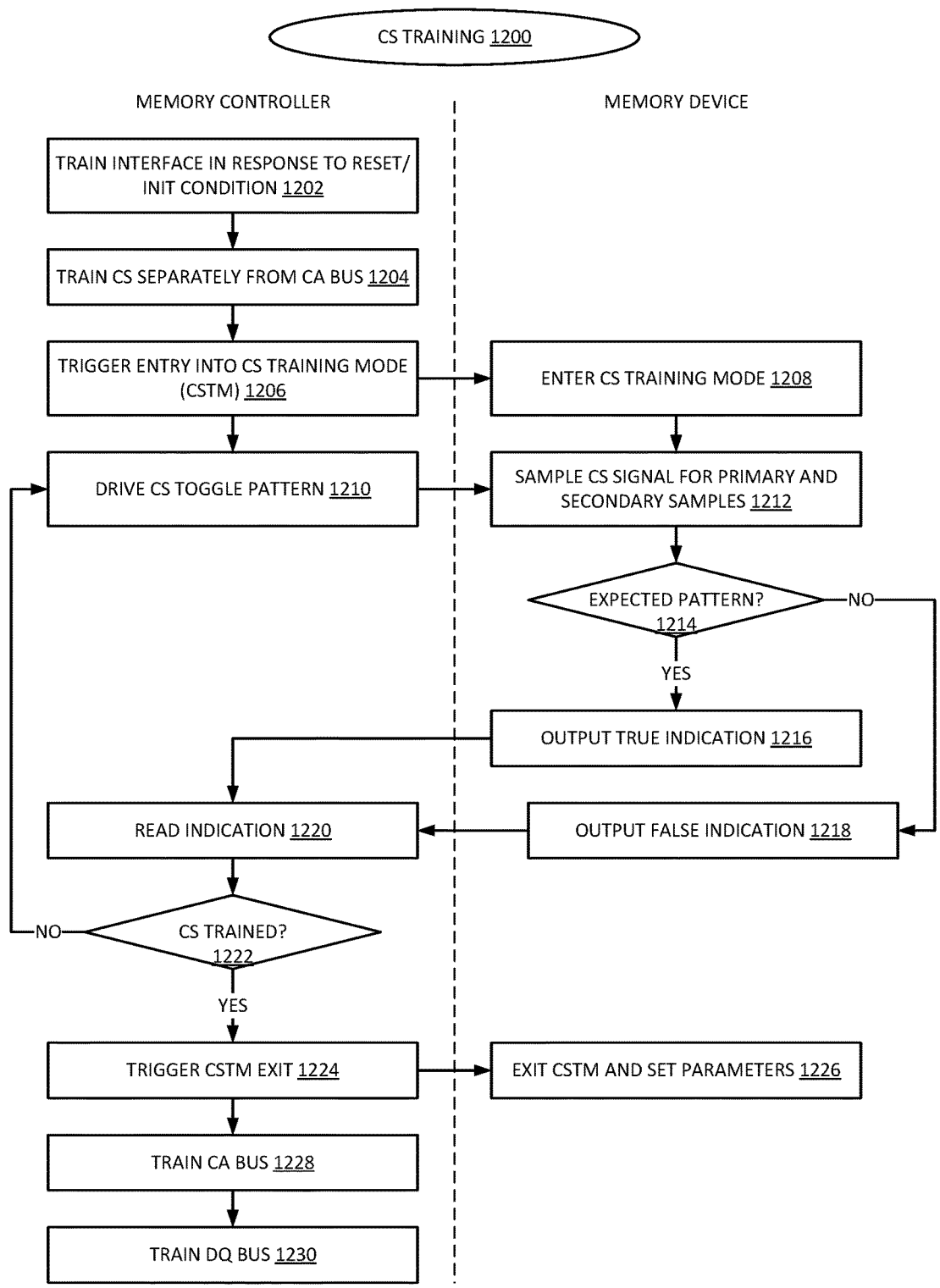
FIG. 12 is a flow diagram of an embodiment of a process for chip select training.

FIG. 12 is a flow diagram of an embodiment of a process for chip select training. Process 1200 illustrates one example of CS training as separate from CA training. In one embodiment, a memory controller trains an I/O interface between the memory controller and a memory device in response to a reset or initialization condition, 1202. The CS signal line is trained separately from other signal lines of the CA bus of the I/O interface, 1204. In one embodiment, the memory controller sends a command or sequence of commands to the memory device to trigger entry into a CS training mode, 1206. In response to the trigger, the memory device enters a CS training mode, 1208.

In one embodiment, in the CS training mode, the memory controller drives a toggle pattern on the CS signal line and the signal pin, 1210. In one embodiment, the memory device samples the CS signal for primary and secondary samples, 1212. If the pattern of the two samples matches an expected pattern, 1214 YES branch, the memory device generates a true indication, 1216. If the pattern of the two samples does not match the expected pattern, 1214 NO branch, the memory device generates a false indication, 1218.

In one embodiment, the memory controller reads the indication provided by the memory device, 1220. In one embodiment, a true indication indicates that the CS signal is trained, and a false indication indicates that the CS signal is not trained. In one embodiment, if the CS signal is not trained, 1222 NO branch, the memory controller causes the memory device to change at least one I/O parameter and repeats driving the CS toggle pattern, 1210.

In one embodiment, if the CS is trained, 1222 YES branch, the memory controller triggers a CSTM exit, 1224. In response to triggering the CSTM exit, the memory device exits CSTM and sets the parameters trained for the CS signal, 1226. In one embodiment, after training the CS signal line, the memory controller separately trains the CA bus, 1228. In one embodiment, after training the CS signal line and the CA bus, the memory controller trains the DQ bus, 1230.

Figure 13:
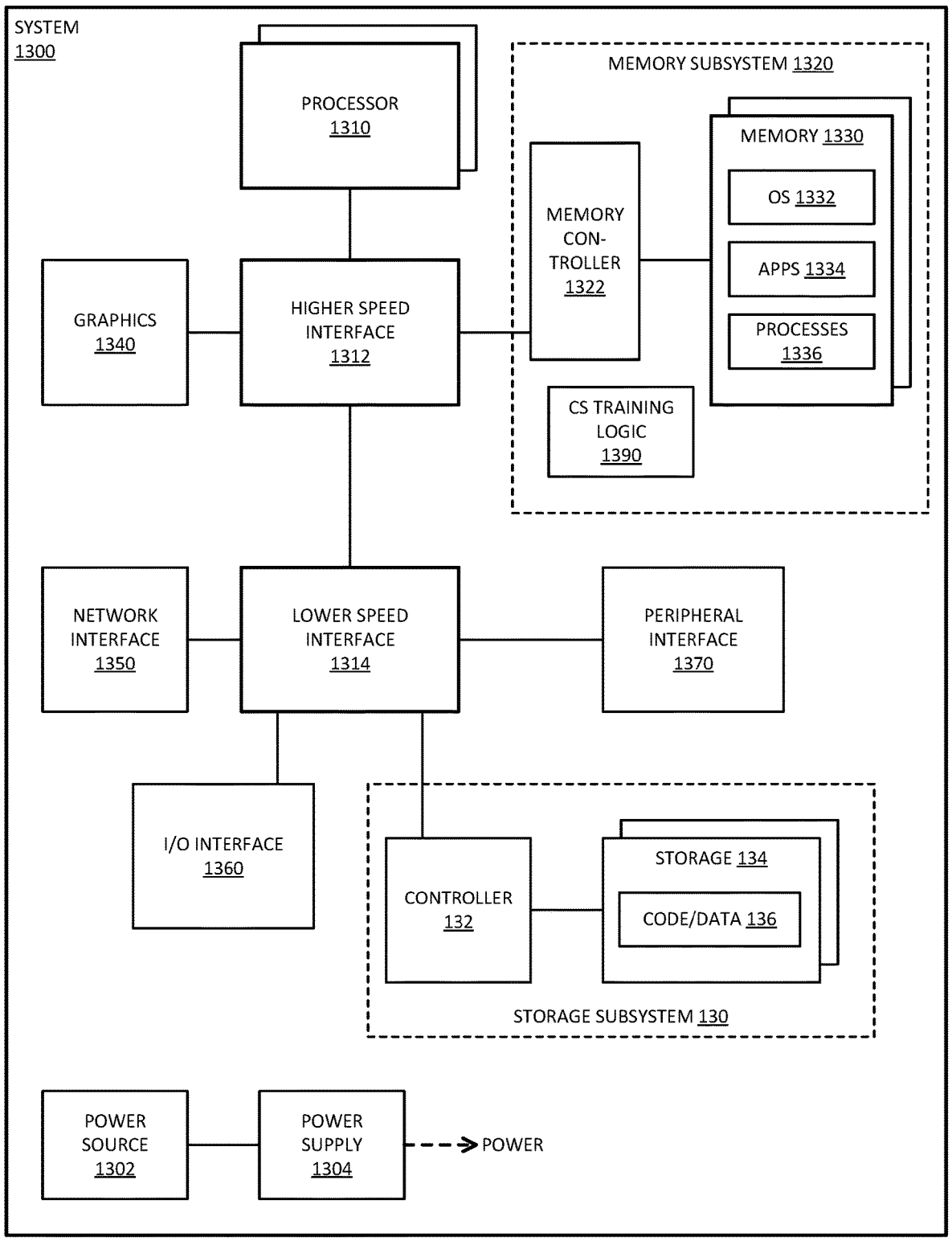
FIG. 13 is a block diagram of an embodiment of a computing system in which a memory system with a chip select training mode can be implemented.

FIG. 13 is a block diagram of an embodiment of a computing system in which a memory system with a chip select training mode can be implemented. System 1300 represents a computing device in accordance with any embodiment described herein, and can be a laptop computer, a desktop computer, a tablet computer, a server, a gaming or entertainment control system, a scanner, copier, printer, routing or switching device, embedded computing device, a smartphone, a wearable device, an internet-of-things device or other electronic device.

System 1300 includes processor 1310, which provides processing, operation management, and execution of instructions for system 1300. Processor 1310 can include any type of microprocessor, central processing unit (CPU), graphics processing unit (GPU), processing core, or other processing hardware to provide processing for system 1300, or a combination of processors. Processor 1310 controls the overall operation of system 1300, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one embodiment, system 1300 includes interface 1312 coupled to processor 1310, which can represent a higher speed interface or a high throughput interface for system components that needs higher bandwidth connections, such as memory subsystem 1320 or graphics interface components 1340. Interface 1312 represents an interface circuit, which can be a standalone component or integrated onto a processor die. Where present, graphics interface 1340 interfaces to graphics components for providing a visual display to a user of system 1300. In one embodiment, graphics interface 1340 can drive a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, the display can include a touchscreen display. In one embodiment, graphics interface 1340 generates a display based on data stored in memory 1330 or based on operations executed by processor 1310 or both. In one embodiment, graphics interface 1340 generates a display based on data stored in memory 1330 or based on operations executed by processor 1310 or both.

Memory subsystem 1320 represents the main memory of system 1300, and provides storage for code to be executed by processor 1310, or data values to be used in executing a routine. Memory subsystem 1320 can include one or more memory devices 1330 such as read-only memory (ROM), flash memory, one or more varieties of random access memory (RAM) such as DRAM, or other memory devices, or a combination of such devices. Memory 1330 stores and hosts, among other things, operating system (OS) 1332 to provide a software platform for execution of instructions in system 1300. Additionally, applications 1334 can execute on the software platform of OS 1332 from memory 1330. Applications 1334 represent programs that have their own operational logic to perform execution of one or more functions. Processes 1336 represent agents or routines that provide auxiliary functions to OS 1332 or one or more applications 1334 or a combination. OS 1332, applications 1334, and processes 1336 provide software logic to provide functions for system 1300. In one embodiment, memory subsystem 1320 includes memory controller 1322, which is a memory controller to generate and issue commands to memory 1330. It will be understood that memory controller 1322 could be a physical part of processor 1310 or a physical part of interface 1312. For example, memory controller 1322 can be an integrated memory controller, integrated onto a circuit with processor 1310.

While not specifically illustrated, it will be understood that system 1300 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus.

In one embodiment, system 1300 includes interface 1314, which can be coupled to interface 1312. Interface 1314 can be a lower speed interface than interface 1312. In one embodiment, interface 1314 represents an interface circuit, which can include standalone components and integrated circuitry. In one embodiment, multiple user interface components or peripheral components, or both, couple to interface 1314. Network interface 1350 provides system 1300 the ability to communicate with remote devices (e.g., servers or other computing devices) over one or more networks. Network interface 1350 can include an Ethernet adapter, wireless interconnection components, cellular network interconnection components, USB (universal serial bus), or other wired or wireless standards-based or proprietary interfaces. Network interface 1350 can exchange data with a remote device, which can include sending data stored in memory or receiving data to be stored in memory.

In one embodiment, system 1300 includes one or more input/output (I/O) interface(s) 1360. I/O interface 1360 can include one or more interface components through which a user interacts with system 1300 (e.g., audio, alphanumeric, tactile/touch, or other interfacing). Peripheral interface 1370 can include any hardware interface not specifically mentioned above. Peripherals refer generally to devices that connect dependently to system 1300. A dependent connection is one where system 1300 provides the software platform or hardware platform or both on which operation executes, and with which a user interacts.

In one embodiment, system 1300 includes storage subsystem 1380 to store data in a nonvolatile manner. In one embodiment, in certain system implementations, at least certain components of storage 1380 can overlap with components of memory subsystem 1320. Storage subsystem 1380 includes storage device(s) 1384, which can be or include any conventional medium for storing large amounts of data in a nonvolatile manner, such as one or more magnetic, solid state, or optical based disks, or a combination. Storage 1384 holds code or instructions and data 1386 in a persistent state (i.e., the value is retained despite interruption of power to system 1300). Storage 1384 can be generically considered to be a "memory," although memory 1330 is typically the executing or operating memory to provide instructions to processor 1310. Whereas storage 1384 is nonvolatile, memory 1330 can include volatile memory (i.e., the value or state of the data is indeterminate if power is interrupted to system 1300). In one embodiment, storage subsystem 1380 includes controller 1382 to interface with storage 1384. In one embodiment controller 1382 is a physical part of interface 1314 or processor 1310, or can include circuits or logic in both processor 1310 and interface 1314.

Power source 1302 provides power to the components of system 1300. More specifically, power source 1302 typically interfaces to one or multiple power supplies 1304 in system 1302 to provide power to the components of system 1300. In one embodiment, power supply 1304 includes an AC to DC (alternating current to direct current) adapter to plug into a wall outlet. Such AC power can be renewable energy (e.g., solar power) power source 1302. In one embodiment, power source 1302 includes a DC power source, such as an external AC to DC converter. In one embodiment, power source 1302 or power supply 1304 includes wireless charging hardware to charge via proximity to a charging field. In one embodiment, power source 1302 can include an internal battery or fuel cell source.

In one embodiment, memory subsystem 1320 includes CS training logic 1390. Logic 1390 can include logic at memory controller 1322 to trigger a CS training mode and send signals to train the CS signal line separately from the CA bus. Logic 1390 can include logic at memory 1330 to sample and provide feedback in response to the CS signals. In the CS training mode the memory can indicate when the CS signal samples according to what is expected. The CS training mode can be in accordance with any embodiment described herein. In one embodiment, the memory controller can adjust a pulse of the CS signal.

Figure 14:
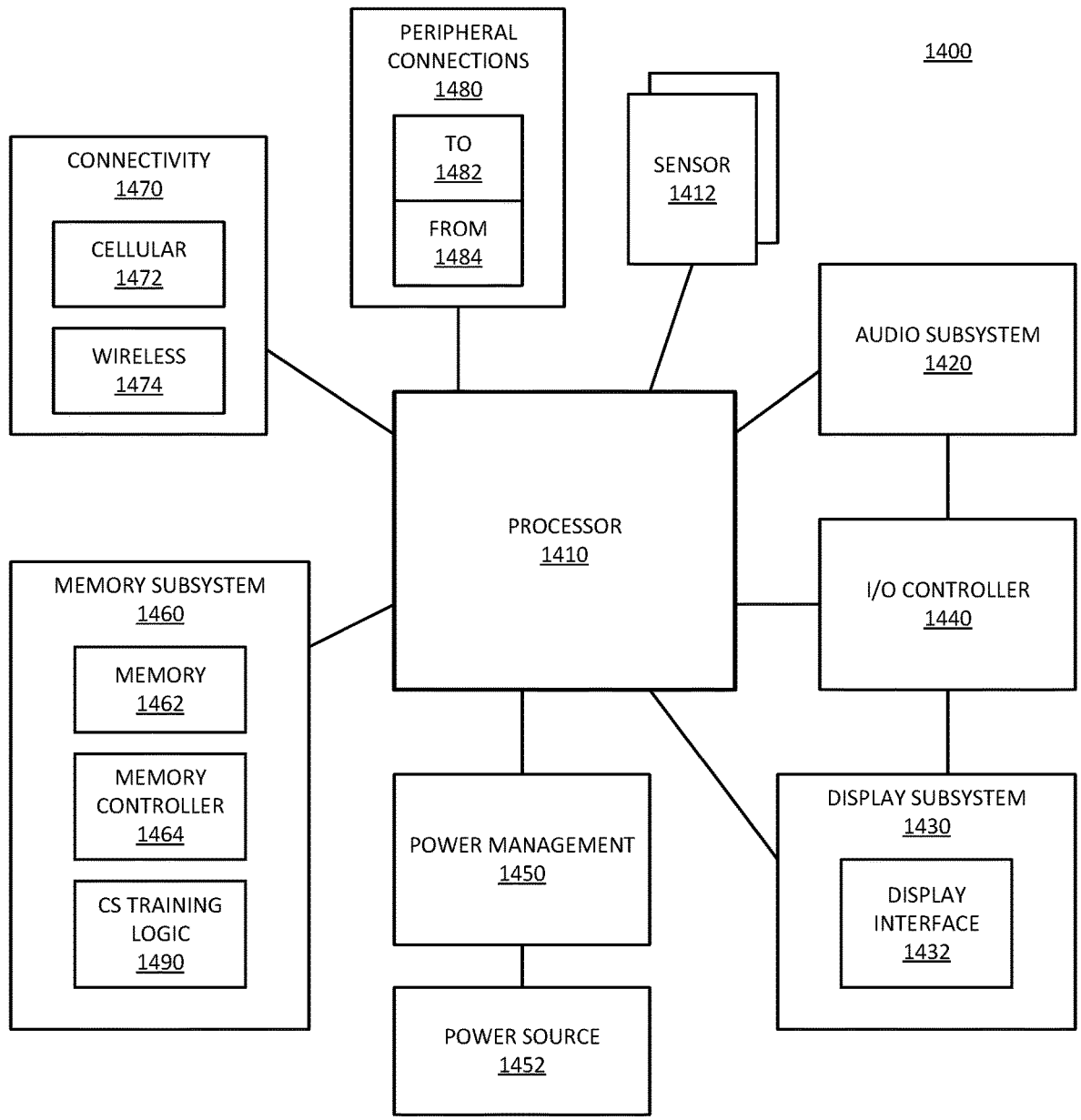
FIG. 14 is a block diagram of an embodiment of a mobile device in which a memory system with a chip select training mode can be implemented.

FIG. 14 is a block diagram of an embodiment of a mobile device in which a memory system with a chip select training mode can be implemented. Device 1400 represents a mobile computing device, such as a computing tablet, a mobile phone or smartphone, a wireless-enabled e-reader, wearable computing device, an internet-of-things device or other mobile device, or an embedded computing device. It will be understood that certain of the components are shown generally, and not all components of such a device are shown in device 1400.

Device 1400 includes processor 1410, which performs the primary processing operations of device 1400. Processor 1410 can include one or more physical devices, such as microprocessors, application processors, microcontrollers, programmable logic devices, or other processing means. The processing operations performed by processor 1410 include the execution of an operating platform or operating system on which applications and device functions are executed. The processing operations include operations related to I/O (input/output) with a human user or with other devices, operations related to power management, operations related to connecting device 1400 to another device, or a combination. The processing operations can also include operations related to audio I/O, display I/O, or other interfacing, or a combination. Processor 1410 can execute data stored in memory. Processor 1410 can write or edit data stored in memory.

In one embodiment, system 1400 includes one or more sensors 1412. Sensors 1412 represent embedded sensors or interfaces to external sensors, or a combination. Sensors 1412 enable system 1400 to monitor or detect one or more conditions of an environment or a device in which system 1400 is implemented. Sensors 1412 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1412 can also include sensors for biometric systems such as fingerprint recognition systems, face detection or recognition systems, or other systems that detect or recognize user features. Sensors 1412 should be understood broadly, and not limiting on the many different types of sensors that could be implemented with system 1400. In one embodiment, one or more sensors 1412 couples to processor 1410 via a frontend circuit integrated with processor 1410. In one embodiment, one or more sensors 1412 couples to processor 1410 via another component of system 1400.

In one embodiment, device 1400 includes audio subsystem 1420, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1400, or connected to device 1400. In one embodiment, a user interacts with device 1400 by providing audio commands that are received and processed by processor 1410.

Display subsystem 1430 represents hardware (e.g., display devices) and software components (e.g., drivers) that provide a visual display for presentation to a user. In one embodiment, the display includes tactile components or touchscreen elements for a user to interact with the computing device. Display subsystem 1430 includes display interface 1432, which includes the particular screen or hardware device used to provide a display to a user. In one embodiment, display interface 1432 includes logic separate from processor 1410 (such as a graphics processor) to perform at least some processing related to the display. In one embodiment, display subsystem 1430 includes a touchscreen device that provides both output and input to a user. In one embodiment, display subsystem 1430 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem includes a touchscreen display. In one embodiment, display subsystem 1430 generates display information based on data stored in memory or based on operations executed by processor 1410 or both.

I/O controller 1440 represents hardware devices and software components related to interaction with a user. I/O controller 1440 can operate to manage hardware that is part of audio subsystem 1420, or display subsystem 1430, or both. Additionally, I/O controller 1440 illustrates a connection point for additional devices that connect to device 1400 through which a user might interact with the system. For example, devices that can be attached to device 1400 might include microphone devices, speaker or stereo systems, video systems or other display device, keyboard or keypad devices, or other I/O devices for use with specific applications such as card readers or other devices.

As mentioned above, I/O controller 1440 can interact with audio subsystem 1420 or display subsystem 1430 or both. For example, input through a microphone or other audio device can provide input or commands for one or more applications or functions of device 1400. Additionally, audio output can be provided instead of or in addition to display output. In another example, if display subsystem includes a touchscreen, the display device also acts as an input device, which can be at least partially managed by I/O controller 1440. There can also be additional buttons or switches on device 1400 to provide I/O functions managed by I/O controller 1440.

In one embodiment, I/O controller 1440 manages devices such as accelerometers, cameras, light sensors or other environmental sensors, gyroscopes, global positioning system (GPS), or other hardware that can be included in device 1400, or sensors 1412. The input can be part of direct user interaction, as well as providing environmental input to the system to influence its operations (such as filtering for noise, adjusting displays for brightness detection, applying a flash for a camera, or other features).

In one embodiment, device 1400 includes power management 1450 that manages battery power usage, charging of the battery, and features related to power saving operation. Power management 1450 manages power from power source 1452, which provides power to the components of system 1400. In one embodiment, power source 1452 includes an AC to DC (alternating current to direct current) adapter to plug into a wall outlet. Such AC power can be renewable energy (e.g., solar power, motion based power). In one embodiment, power source 1452 includes only DC power, which can be provided by a DC power source, such as an external AC to DC converter. In one embodiment, power source 1452 includes wireless charging hardware to charge via proximity to a charging field. In one embodiment, power source 1452 can include an internal battery or fuel cell source.

Memory subsystem 1460 includes memory device(s) 1462 for storing information in device 1400. Memory subsystem 1460 can include nonvolatile (state does not change if power to the memory device is interrupted) or volatile (state is indeterminate if power to the memory device is interrupted) memory devices, or a combination. Memory 1460 can store application data, user data, music, photos, documents, or other data, as well as system data (whether long-term or temporary) related to the execution of the applications and functions of system 1400. In one embodiment, memory subsystem 1460 includes memory controller 1464 (which could also be considered part of the control of system 1400, and could potentially be considered part of processor 1410). Memory controller 1464 includes a scheduler to generate and issue commands to control access to memory device 1462.

Connectivity 1470 includes hardware devices (e.g., wireless or wired connectors and communication hardware, or a combination of wired and wireless hardware) and software components (e.g., drivers, protocol stacks) to enable device 1400 to communicate with external devices. The external device could be separate devices, such as other computing devices, wireless access points or base stations, as well as peripherals such as headsets, printers, or other devices. In one embodiment, system 1400 exchanges data with an external device for storage in memory or for display on a display device. The exchanged data can include data to be stored in memory, or data already stored in memory, to read, write, or edit data.

Connectivity 1470 can include multiple different types of connectivity. To generalize, device 1400 is illustrated with cellular connectivity 1472 and wireless connectivity 1474. Cellular connectivity 1472 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1474 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1480 include hardware interfaces and connectors, as well as software components (e.g., drivers, protocol stacks) to make peripheral connections. It will be understood that device 1400 could both be a peripheral device ("to" 1482) to other computing devices, as well as have peripheral devices ("from" 1484) connected to it. Device 1400 commonly has a "docking" connector to connect to other computing devices for purposes such as managing (e.g., downloading, uploading, changing, synchronizing) content on device 1400. Additionally, a docking connector can allow device 1400 to connect to certain peripherals that allow device 1400 to control content output, for example, to audiovisual or other systems.

In addition to a proprietary docking connector or other proprietary connection hardware, device 1400 can make peripheral connections 1480 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 1460 includes CS training logic 1390. Logic 1490 can include logic at memory controller 1464 to trigger a CS training mode and send signals to train the CS signal line separately from the CA bus. Logic 1490 can include logic at memory 1462 to sample and provide feedback in response to the CS signals. In the CS training mode the memory can indicate when the CS signal samples according to what is expected. The CS training mode can be in accordance with any embodiment described herein. In one embodiment, the memory controller can adjust a pulse of the CS signal.

In one aspect, a dynamic random access memory (DRAM) device includes: a memory array including addressable memory locations; and I/O (input/output) circuitry including an interface to a command bus and an interface to a chip select (CS) signal line, the I/O circuitry to receive a first command to trigger the DRAM device for a chip select training mode (CSTM); wherein in the CSTM mode, the DRAM device is to train signal margining for the CS signal line separately from command bus training, to align chip select signaling with a clock signal.

In one embodiment, the DRAM device comprises a synchronous dynamic random access memory (SDRAM) device compatible with a double data rate (DDR) standard. In one embodiment, the DRAM device is to perform CS training prior to command bus training to train the command bus. In one embodiment, in the CSTM mode, the command bus is to be held in a NOP (no operation) encoding state. In one embodiment, in the CSTM mode, a clock signal of the I/O circuitry is to run continuously. In one embodiment, the DRAM device is to align chip select signaling with the clock signal based on a transition of logic value between a first sample on a first rising clock edge and a second sample on a second rising clock edge. In one embodiment, every other rising clock edge is to be considered a primary sample, and other rising clock edges are to be considered secondary samples. In one embodiment, the I/O circuitry includes interfaces to a data bus, and wherein when a primary sample results in a logic zero and a next subsequent secondary sample results in a logic one, the I/O circuitry is to drive zero on all data signals of the data bus. In one embodiment, the signal margining comprises voltage margining. In one embodiment, the signal margining comprises timing margining.

In one aspect, a system with a memory subsystem includes: a memory controller; and multiple dynamic random access memory (DRAM) devices in accordance with any embodiment of a DRAM of the preceding two paragraphs. In one embodiment, further comprising one or more of: at least one processor communicatively coupled to the memory controller; a display communicatively coupled to at least one processor; a network interface communicatively coupled to at least one processor; or a battery to power the system.

In one aspect, a method for memory interface training includes: receiving a first command to trigger a chip select training mode (CSTM) in a dynamic random access memory (DRAM) device having an interface to a command bus and an interface to a chip select (CS) signal line; training signal margining in the CSTM for the CS signal line separately from command bus training, to align chip select signaling with a clock signal.

In one embodiment, the DRAM device comprises a synchronous dynamic random access memory (SDRAM) device compatible with a double data rate (DDR) standard. In one embodiment, training the CS signal line comprises performing the training prior to training the command bus. In one embodiment, training the CS signal line comprises training in the CSTM mode with the command bus held in a NOP (no operation) encoding state. In one embodiment, training the CS signal line comprises training in the CSTM mode with a clock signal of the I/O circuitry running continuously. In one embodiment, training comprises aligning chip select signaling with the clock signal based on a transition of logic value between a first sample on a first rising clock edge and a second sample on a second rising clock edge. In one embodiment, every other rising clock edge is to be considered a primary sample, and other rising clock edges are to be considered secondary samples. In one embodiment, when a primary sample results in a logic zero and a next subsequent secondary sample results in a logic one, driving zero on all data signals of a data bus. In one embodiment, the signal margining comprises voltage margining. In one embodiment, the signal margining comprises timing margining.

In one aspect, an apparatus comprising means for performing operations to execute a method in accordance with any embodiment of the preceding two paragraphs. In one aspect, an article of manufacture comprising a computer readable storage medium having content stored thereon to provide instructions to cause a machine to perform operations to execute a method in accordance with any embodiment of the preceding two paragraphs.

In one aspect, a memory controller includes: command logic to generate commands to train a chip select (CS) signal interface of an associated dynamic random access memory (DRAM) device, including a first command and training commands; and I/O (input/output) circuitry including an interface to a command bus and an interface to a chip select (CS) signal line, the I/O circuitry to send the first command to trigger the DRAM device for a chip select training mode (CSTM); wherein in the CSTM mode, the I/O circuitry is to send the training commands to cause the DRAM device to train signal margining for the CS signal line separately from command bus training, to align chip select signaling with a clock signal at the DRAM device.

In one embodiment, the command logic is to generate the first command to trigger CS training prior to command bus training to train the command bus. In one embodiment, in the CSTM mode, the I/O circuitry is to hold the command bus in a NOP (no operation) encoding state. In one embodiment, when the DRAM device is in the CSTM mode, the I/O circuitry is to continuously drive a clock signal to the DRAM device. In one embodiment, the DRAM device is to align chip select signaling with the clock signal based on a transition of logic value between a first sample on a first rising clock edge and a second sample on a second rising clock edge. In one embodiment, every other rising clock edge is to be considered a primary sample, and other rising clock edges are to be considered secondary samples. In one embodiment, the I/O circuitry includes interfaces to a data bus, and wherein when a primary sample results in a logic zero and a next subsequent secondary sample results in a logic one, the I/O circuitry is to receive zero on all data signals of the data bus from the DRAM device. In one embodiment, the signal margining comprises voltage margining. In one embodiment, the signal margining comprises timing margining. In one embodiment, the DRAM device comprises a synchronous dynamic random access memory (SDRAM) device compatible with a double data rate (DDR) standard. In one embodiment, the SDRAM device comprises an SDRAM device compatible with a DDR version 5 (DDR5) standard.

In one aspect, a system with a memory subsystem includes: a dynamic random access memory (DRAM) device; and a memory controller in accordance with any embodiment of the preceding two paragraphs. In one embodiment, further comprising one or more of: at least one processor communicatively coupled to the memory controller; a display communicatively coupled to at least one processor; a network interface communicatively coupled to at least one processor; or a battery to power the system.

In one aspect, a method for memory interface training includes: sending a first command to trigger a chip select training mode (CSTM) in a dynamic random access memory (DRAM) device having an interface to a command bus and an interface to a chip select (CS) signal line; sending additional commands to train signal margining in the CSTM for the CS signal line separately from command bus training, to align chip select signaling with a clock signal.

In one embodiment, sending the additional commands to train the CS signal line comprises triggering CS training prior to command bus training to train the command bus. In one embodiment, further comprising: holding the command bus in a NOP (no operation) encoding state. In one embodiment, further comprising: continuously driving a clock signal to the DRAM device in CSTM mode. In one embodiment, sending the additional commands to train the CS signal line comprises aligning chip select signaling with the clock signal based on a transition of logic value between a first sample on a first rising clock edge and a second sample on a second rising clock edge. In one embodiment, every other rising clock edge is to be considered a primary sample, and other rising clock edges are to be considered secondary samples. In one embodiment, when a primary sample results in a logic zero and a next subsequent secondary sample results in a logic one, the I/O circuitry is to receive zero on all data signals of a data bus from the DRAM device. In one embodiment, the signal margining comprises voltage margining. In one embodiment, the signal margining comprises timing margining. In one embodiment, the DRAM device comprises a synchronous dynamic random access memory (SDRAM) device compatible with a double data rate (DDR) standard. In one embodiment, the SDRAM device comprises an SDRAM device compatible with a DDR version 5 (DDR5) standard.

In one aspect, an apparatus comprising means for performing operations to execute a method in accordance with any embodiment of the preceding two paragraphs. In one aspect, an article of manufacture comprising a computer readable storage medium having content stored thereon to provide instructions to cause a machine to perform operations to execute a method in accordance with any embodiment of the preceding two paragraphs.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device, comprising:
a hardware interface to interface with a command bus and a chip select (CS) signal line, the hardware interface to receive a command on the command bus to trigger training of signaling on the CS signal line separately from training of signaling on the command bus; wherein the memory device is to perform CS training prior to command bus training to train the command bus.

2. The memory device of claim 1, wherein receipt of the command to trigger training of signaling on the CS signal line is to trigger a chip select training mode (CSTM), wherein in the CSTM mode, the command bus is to be held in a NOP (no operation) command encoding state.

3. The memory device of claim 2, wherein in the CSTM mode, a clock signal associated with the command bus is to run continuously.

4. The memory device of claim 3, wherein the memory device is to align chip select signaling with the clock signal based on a transition of logic value between a first sample on a first rising clock edge and a second sample on a second rising clock edge.

5. The memory device of claim 4, wherein the hardware interface comprises a command and address hardware interface and further comprising a data hardware interface to interface with a data bus having multiple data (DQ) signal lines; and
wherein when the first sample is a logic zero and the second sample is a logic one, the data hardware interface is to drive a zero on the data bus.

6. The memory device of claim 5, wherein the data hardware interface is to drive zeros on the multiple DQ signal lines of the data bus.

7. The memory device of claim 1, wherein training of signaling on the CS signal line comprises the hardware interface to sample a signal sequence of the CS signal line and loopback the sampled signal sequence to an associated memory controller.

8. The memory device of claim 1, wherein the memory device comprises a synchronous dynamic random access memory (SDRAM) device compatible with a double data rate (DDR) standard.

9. A memory controller, comprising:
command logic to generate commands to train a chip select (CS) signal interface of an associated memory device, including a first command and training commands; and
a hardware interface to interface with a command bus and a CS signal line, the hardware interface to send the commands to train the CS signal interface of the associated memory device, including to send the first command to trigger training of signaling on the CS signal line separately from training signaling on the command bus, and send the training commands to train signal margining of the CS signal line interface of the associated memory device, wherein the memory device is to perform CS training prior to command bus training to train the command bus.

10. The memory controller of claim 9, wherein the first command to trigger training of signaling on the CS signal line is to trigger a chip select training mode (CSTM), wherein in the CSTM mode, the command logic is to hold the command bus in a NOP (no operation) command encoding state.

11. The memory controller of claim 10, wherein the memory device is to align chip select signaling with a clock signal based on a transition of logic value between a first sample on a first rising clock edge and a second sample on a second rising clock edge.

12. The memory controller of claim 11, wherein the hardware interface comprises a command and address hardware interface and further comprising a data hardware interface to interface with a data bus having multiple data (DQ) signal lines; and wherein when the first sample is a logic zero and the second sample is a logic one, the data hardware interface is to receive a zero on the data bus from the memory device.

13. The memory controller of claim 9, wherein training of signaling on the CS signal line comprises the hardware interface to generate a signal sequence of the CS signal line and receive a loopback of the signal sequence sampled by the memory device.

14. The memory controller of claim 9, wherein the memory device comprises a synchronous dynamic random access memory (SDRAM) device compatible with a double data rate (DDR) standard.

15. A system, comprising:

a memory controller; and multiple memory devices, wherein a memory device includes a hardware interface to interface with a command bus and a chip select (CS) signal line, the hardware interface to receive a command on the command bus to trigger training signaling on the CS signal line separately from training signaling on the command bus;

wherein the memory device is to perform CS training prior to command bus training to train the command bus.

16. The system of claim 15, wherein receipt of the command to trigger training of signaling on the CS signal line is to trigger a chip select training mode (CSTM), wherein in the CSTM mode, the command bus is to be held in a NOP (no operation) command encoding state.

17. The system of claim 15, wherein the hardware interface comprises a command and address hardware interface and further comprising a data hardware interface to interface with a data bus having multiple data (DQ) signal lines; and wherein the memory device is to align chip select signaling with a clock signal based on a transition of logic value between a first sample on a first rising clock edge and a second sample on a second rising clock edge, wherein when the first sample is a logic zero and the second sample is a logic one, the data hardware interface is to drive a zero on the data bus.

18. The system of claim 15, wherein the memory device comprises a synchronous dynamic random access memory (SDRAM) device compatible with a double data rate (DDR) standard.

19. The system of claim 15, further comprising one or more of:

at least one processor communicatively coupled to the memory controller;

a display communicatively coupled to at least one processor;

a network interface communicatively coupled to at least one processor; or a battery to power the system.

\* \* \* \* \*